United States Patent
Fudo et al.

(10) Patent No.: US 12,207,558 B2
(45) Date of Patent: Jan. 21, 2025

(54) COMPOSITE PIEZOELECTRIC ELEMENT, TIRE-CONDITION MEASURING APPARATUS, TIRE SENSOR MODULE, TIRE SENSOR, AND PIEZOELECTRIC SENSOR

(71) Applicant: Alps Alpine Co., Ltd., Tokyo (JP)

(72) Inventors: Heishiro Fudo, Miyagi-ken (JP); Eiji Shinohara, Miyagi-ken (JP); Akihito Yamamoto, Miyagi-ken (JP); Shinya Ichise, Miyagi-ken (JP); Yuki Ono, Miyagi-ken (JP); Hisashi Komatsu, Miyagi-ken (JP); Hiroyuki Tobari, Miyagi-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 848 days.

(21) Appl. No.: 17/323,523

(22) Filed: May 18, 2021

(65) Prior Publication Data

US 2021/0273153 A1 Sep. 2, 2021

Related U.S. Application Data

(63) Continuation of application No. PCT/JP2019/049320, filed on Dec. 17, 2019.

(30) Foreign Application Priority Data

Dec. 17, 2018 (JP) .................................. 2018-235468
Mar. 5, 2019 (JP) .................................. 2019-039756

(51) Int. Cl.
*H10N 30/30* (2023.01)
*H10N 30/87* (2023.01)

(52) U.S. Cl.
CPC ......... *H10N 30/302* (2023.02); *H10N 30/871* (2023.02)

(58) Field of Classification Search
CPC .... H10N 30/302; H10N 30/871; H10N 30/88; B60C 23/0411; B60C 19/00; G01B 7/16
See application file for complete search history.

(56) References Cited

U.S. PATENT DOCUMENTS 6,105,423 A      8/2000  Prottey
9,932,022 B2 *   4/2018  Weston .................. B60T 8/1725
(Continued)

FOREIGN PATENT DOCUMENTS

CN    106461486       2/2017
DE    10 2008 035486  3/2009
(Continued)

OTHER PUBLICATIONS

International Search Report from International Application No. PCT/JP2019/049320 dated Mar. 10, 2020.
(Continued)

*Primary Examiner* — J. San Martin
(74) *Attorney, Agent, or Firm* — Beyer Law Group LLP

(57) ABSTRACT

A composite piezoelectric element includes a first electrode layer, a piezoelectric substance layer disposed on the first electrode layer, and a second electrode layer disposed on the piezoelectric substance layer, and, in plan view, a measuring unit including the first electrode layer, the piezoelectric substance layer, and the second electrode layer and a buffer portion in which the piezoelectric substance layer is not provided.

9 Claims, 15 Drawing Sheets

(56) References Cited

U.S. PATENT DOCUMENTS

| | | |
|---|---|---|
| 10,603,962 B2 | 3/2020 | Singh |
| 2006/0260390 A1 | 11/2006 | Oflaz |
| 2009/0205435 A1* | 8/2009 | Buck .................... G01L 9/0022 |
| | | 73/753 |
| 2009/0206703 A1* | 8/2009 | Reichenbach ........... H02N 2/18 |
| | | 310/339 |
| 2010/0043541 A1 | 2/2010 | Kobayakawa |
| 2010/0165309 A1 | 7/2010 | Kamiyama et al. |
| 2011/0113876 A1 | 5/2011 | Kammann |
| 2015/0090023 A1 | 4/2015 | Masago |
| 2017/0190227 A1 | 7/2017 | Genmei |
| 2019/0184773 A1* | 6/2019 | Saito .................... B60C 23/0422 |
| 2019/0359010 A1 | 11/2019 | Setokawa et al. |

FOREIGN PATENT DOCUMENTS

| | | |
|---|---|---|
| EP | 2658734 | 6/2016 |
| JP | H11-248725 | 9/1999 |
| JP | 2003-262501 | 9/2003 |
| JP | 2010-101842 | 5/2010 |
| JP | 2014-234038 | 12/2014 |
| JP | 2017-114438 | 6/2017 |
| KR | 10-1925775 | 11/2018 |
| WO | 2010/005081 | 7/2009 |
| WO | 2016/002262 | 1/2016 |

OTHER PUBLICATIONS

Japanese Office Action (Notice of Reasons for Refusal dated May 13, 2022) mailed on May 24, 2022, from Japanese Application No. 2020-561447, with translation.

Japanese Office Action (Notice of Reasons for Refusal dated Apr. 18, 2023) mailed on Apr. 25, 2023, from Japanese Application No. 2022-116258, with translation.

Extended European Search Report and Search Opinion for European Application No. 19899639.9-1001 dated Aug. 12, 2022.

Chinese First Office Action from Chinese Application No. 201980078032.4, dated Aug. 24, 2022, with translation.

* cited by examiner

COMPOSITE PIEZOELECTRIC ELEMENT, TIRE-CONDITION MEASURING APPARATUS, TIRE SENSOR MODULE, TIRE SENSOR, AND PIEZOELECTRIC SENSOR

CLAIM OF PRIORITY

This application is a Continuation of International Application No. PCT/JP2019/049320 filed on Dec. 17, 2019, which claims benefit of Japanese Patent Application No. 2018-235468 filed on Dec. 17, 2018 and No. 2019-039756 filed on Mar. 5, 2019. The entire contents of each application noted above are hereby incorporated by reference.

BACKGROUND OF THE INVENTION

1. Field of the Invention

The present invention relates to a composite piezoelectric element for use in various sensors, a tire-condition measuring apparatus using the composite piezoelectric element, a tire sensor module including a sheet-like piezoelectric sensor for detecting deformation of a tire, a tire sensor including it, and a piezoelectric sensor.

2. Description of the Related Art

Piezoelectric elements have the function of converting electrical energy and mechanical energy to each other and are used as various actuators and sensors. For example, a film-like piezoelectric element having flexibility is sometimes used to measure the condition of a tire using electrical energy generated by deformation. Japanese Unexamined Patent Application Publication No. 2014-234038 describes a method for presuming the posture angle of a tire and the condition of a road surface with a piezoelectric film disposed in the tire. Japanese Unexamined Patent Application Publication No. 2014-234038 also describes a road-surface-condition presuming apparatus in which a piezoelectric sensor is disposed on the inner surface of the tread of a tire as an apparatus for presuming the tire installation condition by detecting the deformation of the tire.

A tire sensor for detecting the condition of a road surface or the condition of a tire is proposed which includes a container on the inner surface of the tread of the tire and a tire sensor module attachable to the container. The tire sensor detects the road surface condition by detecting vibration transmitted to the tire using an acceleration sensor provided at the tire sensor module and analyzing the waveform of the vibration. For example, Japanese Unexamined Patent Application Publication No. 2017-114438 describes a mount sensor (a tire sensor module) in which protrusions are provided at a mold resin that seals an acceleration sensor, a circuit board, and an antenna to facilitate recognition in an acceleration detecting direction. However, a tire sensor module with a sheet-like piezoelectric sensor (piezoelectric element) built in part of it has not been proposed.

In the method described in Japanese Unexamined Patent Application Publication No. 2014-234038, a plurality of piezoelectric films with long and short shapes are disposed in the tire in different directions to measure deformation in different directions. However, since piezoelectric elements constituting the piezoelectric films are formed as a single unit, the piezoelectric elements are deformed as a whole when the object to be measured is deformed. For this reason, in measuring deformation in a specific direction, the piezoelectric films are influenced by deformation in directions other than the specific direction. For this reason, it is difficult to measure the deformation generated in the specific direction with high sensitivity and accuracy.

Furthermore, when a sheet-like piezoelectric sensor is sealed by a mold resin, like an acceleration sensor in a tire sensor module, the deformation of the piezoelectric sensor is inhibited by the hard mold resin, so that the detection sensitivity of the piezoelectric sensor to tire deformation is decreased. In other words, in the case where a sheet-like piezoelectric sensor is installed in part of the tire sensor module, sealing the sheet-like piezoelectric sensor with a mold resin, like the acceleration sensor, has the problem of decreasing the detection sensitivity of the piezoelectric sensor.

SUMMARY OF THE INVENTION

The present invention provides a composite piezoelectric element configured to measure the deformation that has occurred in a specific direction with high sensitivity and accuracy, a tire-condition measuring apparatus including the composite piezoelectric element, a tire sensor module including a piezoelectric film having high tire deformation detection sensitivity, a tire sensor including it, and a piezoelectric sensor.

A composite piezoelectric element according to a first aspect of the present invention includes a first electrode layer, a piezoelectric substance layer disposed on the first electrode layer, and a second electrode layer disposed on the piezoelectric substance layer, wherein, in plan view, a measuring unit including the first electrode layer, the piezoelectric substance layer, and the second electrode layer and a buffer portion in which the piezoelectric substance layer is not provided are provided. Providing the buffer portion in which the piezoelectric substance layer is not provided gives anisotropy to the measurement sensitivity of the measuring unit, allowing measuring deformation generated in a specific direction with high sensitivity and accuracy.

The piezoelectric substance layer preferably includes a plurality of belt-like portions in plan view. The belt-like portions preferably have an aspect ratio from 1,000:1 to 10:5. The plurality of belt-like portions are preferably disposed substantially parallel in a longitudinal direction. The buffer portion is preferably formed between the adjacent belt-like portions in the longitudinal direction of the belt-like portions. The buffer portion preferably includes a cutout in the longitudinal direction of the belt-like portions in plan view. The cutout is preferably a slit that continues in the longitudinal direction of the belt-like portions in plan view. The above configuration allows enhancing the anisotropy of the measurement sensitivity of the composite piezoelectric element.

The composite piezoelectric element according to an aspect of the present invention may further include a base film, wherein the first electrode layer may be disposed on the base film. The use of the base film facilitates disposing the composite piezoelectric element at the object to be measured, such as a tire, with the shape of the composite piezoelectric element kept. In this case, the base film is preferably formed in the measuring unit and the buffer portion in plan view, and the buffer portion preferably has a Young's modulus smaller than a Young's modulus of the measuring unit. This configuration allows enhancing the anisotropy of the measurement sensitivity of the composite piezoelectric element.

A tire-condition measuring apparatus according to a second aspect of the present invention includes the composite piezoelectric element according to an aspect of the present invention.

A tire sensor module according to a third aspect of the present invention includes a sheet-like piezoelectric sensor configured to measure deformation of a tire and a control unit configured to perform computational processing of a measurement result of the piezoelectric sensor, wherein a buffer portion is provided between the piezoelectric sensor and the control unit.

Providing the buffer portion between the piezoelectric sensor and the control unit prevents the deformation of the sheet-like piezoelectric sensor following the tire from being inhibited by the control unit. In other words, the sheet-like piezoelectric sensor can be installed in the tire sensor module in a state in which it is easily bent following the deformation of the tire.

The buffer portion may include a soft portion with a Young's modulus smaller than a Young's modulus of the control unit, wherein the soft portion may be in contact with the piezoelectric sensor and the control unit. The Young's modulus of the soft portion may be from 10 to 1,000 MPa.

Since the soft portion that absorbs the deformation of the piezoelectric sensor is in contact with both of the piezoelectric sensor and the control unit, the positional relationship between them can be maintained. This makes the measurement condition constant, improving the measurement accuracy of the piezoelectric sensor.

The buffer portion may include the soft portion and a void. The soft portion may include a slit. Providing the void having no soft portion in the buffer portion or providing the slit in the soft portion facilitates deformation of the soft portion in the buffer portion, which makes it easier for the piezoelectric sensor to be deformed.

The soft portion may include a slit, and the control unit may include an anchor, wherein the anchor may be inserted in the slit. Providing the slit facilitates the deformation of the soft portion, and the anchor allows stably maintaining the positional relationship between the soft portion and the control unit. This makes the measurement condition constant, improving the measurement accuracy of the piezoelectric sensor.

The control unit may include a communication unit. The control unit may include a magnetic sensor, an acceleration sensor, or a magnet.

A tire sensor according to a fourth aspect of the present invention includes the tire sensor module and a container configured to contain the tire sensor module and fixed to inside a tire, the container being elastically deformed. The container may include a container-side anchor for holding the piezoelectric sensor of the tire sensor module at a predetermined position.

The buffer portion may include a soft portion with a Young's modulus smaller than a Young's modulus of the control unit, wherein the soft portion may be in contact with the piezoelectric sensor and the control unit.

A piezoelectric sensor according to a fifth aspect of the present invention is shaped like a sheet and circular in plan view seen from a normal to the sheet. The piezoelectric sensor detects deformation of a tire. The circular shape allows measurement under the same condition regardless of the direction in which the piezoelectric sensor is installed, facilitating the work of installing the piezoelectric sensor at the tire.

The composite piezoelectric element according to an aspect of the present invention can reduce influences of the deformation of the object to be measured generated in directions other than a specific direction on a piezoelectric substance layer by using a buffer portion.

Since the tire sensor module according to an aspect of the present invention includes a buffer portion between the sheet-like piezoelectric sensor and the control unit, the sheet-like piezoelectric sensor is easily deformed following the deformation of the tire, and can detect the deformation of the tire with high sensitivity. Accordingly, a tire sensor module and a tire sensor with high detection sensitivity can be provided.

DESCRIPTION OF THE PREFERRED EMBODIMENTS

Figure 1A:
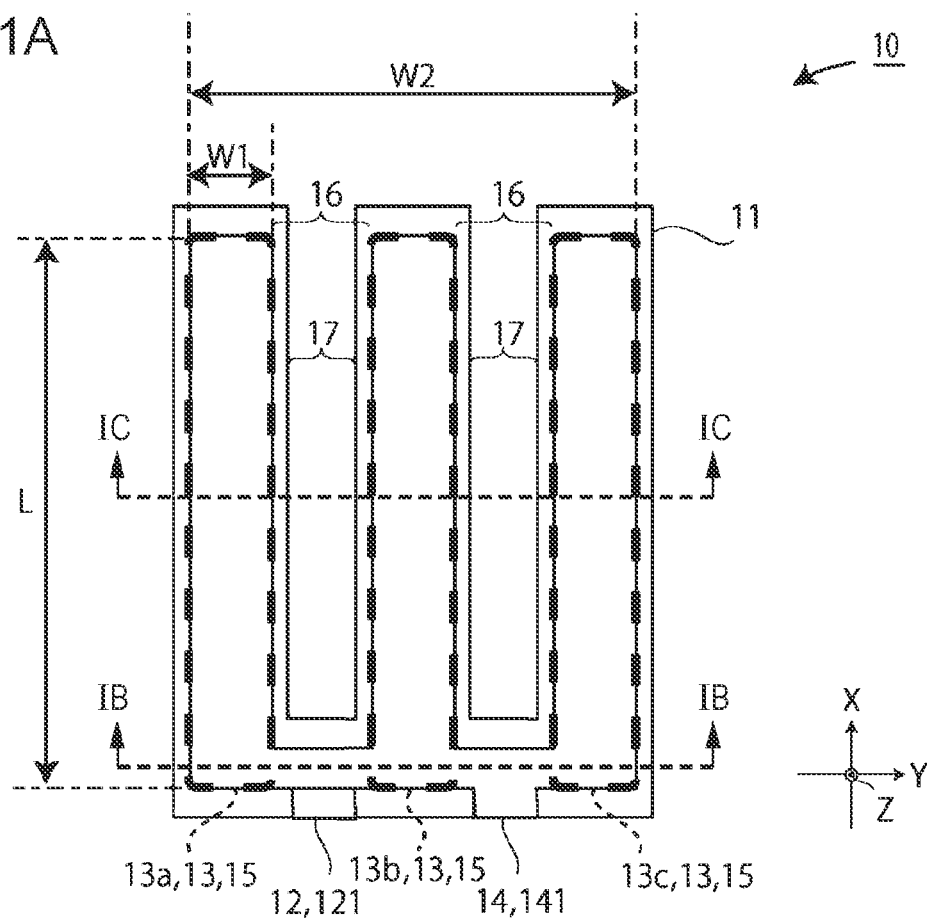
FIG. 1A is schematic plan view of a composite piezoelectric element according to a first embodiment illustrating the configuration thereof.

Embodiments of the present invention will be described hereinbelow with reference to the drawings. In the drawings, the same components are given the same reference signs, and descriptions thereof will be omitted as appropriate.

First Embodiment

Figure 1B:
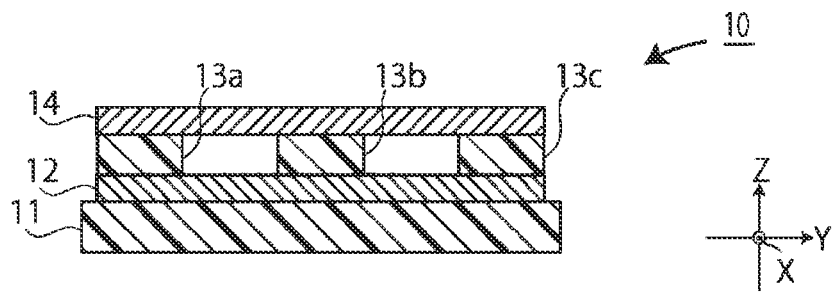
FIG. 1B is a cross-sectional view taken from arrows IB-IB in FIG. 1A.
Figure 1C:
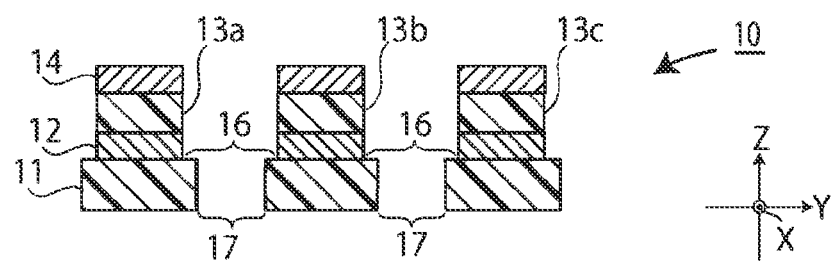
FIG. 1C is a cross-sectional view taken from arrows IC-IC in FIG. 1A.

FIG. 1A is a schematic plan view of a composite piezoelectric element 10 according to this embodiment illustrating the configuration thereof, FIG. 1B is a cross-sectional view taken from arrows IB-IB in FIG. 1A, and FIG. 1C is a cross-sectional view taken from arrows IC-IC in FIG. 1A. As shown in the drawings, the composite piezoelectric element 10 includes a base film 11, a first electrode layer 12 disposed on the base film 11, a piezoelectric substance layer 13 disposed on the first electrode layer, and a second electrode layer 14 disposed on the piezoelectric substance layer 13.

First, the dispositions and shapes of the components of the composite piezoelectric element 10 in plan view will be described. As shown in FIGS. 1A to 1C, the composite piezoelectric element 10 includes measuring units 15 in which the first electrode layer 12, the piezoelectric substance layer 13, and the second electrode layer 14 are laid in this order in the Z direction and buffer portions 16 in which the piezoelectric substance layer 13 is not provided. Not using substantially the whole of the composite piezoelectric element 10 as the measuring units 15 but providing the buffer portions 16 in part of it allows the force applied to the piezoelectric substance layer 13 of the measuring units 15 to be changed depending on the direction in which the object to be measured is deformed to give anisotropy to the measurement sensitivity of the composite piezoelectric element 10.

For the X-direction, the measuring units 15 are continuously disposed. For this reason, when the object to be measured is deformed in the X-direction, the deformation is transmitted as it is to the piezoelectric substance layer 13 of the measuring unit 15. For the Y-direction, the measuring units 15 and the buffer portions 16 are alternately disposed. In other words, the buffer portions 16 are each provided between the measuring units 15. For this reason, when the object to be measured is deformed in the Y-direction, the buffer portion 16 between the measuring units 15 is deformed first, and the deformation is buffered and transmitted to the piezoelectric substance layer 13 of the measuring units 15. This can increase the measurement sensitivity to deformation in the X-direction and decrease the measurement sensitivity to deformation in the Y-direction. Thus, by providing the buffer portions 16 in the composite piezoelectric element 10, the sensitivity can be changed depending on the direction in the X-Y plane so that the deformation of the object to be measured generated in a specific direction can be measured with high sensitivity and accuracy.

The measuring units 15 of the composite piezoelectric element 10 are configured such that the piezoelectric substance layer 13 including a plurality of belt-like portions 13a, 13b, and 13c (hereinafter referred to as belt-like portions 13a to 13c as appropriate) formed in substantially rectangular shape in plan view is disposed between the first electrode layer 12 and the second electrode layer 14 shaped like comb teeth. As shown in FIG. 1A, the plurality of belt-like portions 13a to 13c are disposed substantially parallel in the longitudinal direction. The belt-like portions 13a to 13c may have any shape with different widths in the directions orthogonal to each other, that is, any shape with anisotropy.

The piezoelectric substance layer 13 has not an integral shape in plan view but is divided into the three belt-like portions 13a to 13c disposed at predetermined intervals in the lateral direction (Y-direction). This configuration improves the measurement sensitivity of the composite piezoelectric element 10 in the longitudinal direction (X-direction) and buffers the influence of the deformation in the lateral direction (Y-direction) on the longitudinal direction (X-direction) to allow the deformation in the longitudinal direction (X-direction) to be measured with high sensitivity and accuracy. Since the influence of the deformation in the lateral direction (Y-direction) need only be buffered by the buffer portions 16, the piezoelectric substance layer 13 may have a partially continuous portion.

The buffer portions 16 are formed between the adjacent belt-like portion 13a and belt-like portion 13b and between the adjacent belt-like portion 13b and belt-like portion 13c in the longitudinal direction of the belt-like portions 13a to 13c, and each buffer portion 16 has a cutout 17.

The cutouts 17 can be formed, for example, by forming the composite piezoelectric element 10 and then removing the base film 11 between the belt-like portions 13a to 13c using a laser. The cutouts 17 are portions where the base film 11, the first electrode layer 12, the piezoelectric substance layer 13, and the second electrode layer 14 are not formed. For this reason, when the object to be measured, such as a tire, is deformed in the lateral direction of the belt-like portions 13a to 13c, the cutouts 17 are deformed earlier than the belt-like portions 13a to 13c. The earlier deformation of the cutouts 17 buffers the influence on the piezoelectric substance layer 13, preventing the deformation of the piezoelectric substance layer 13. Thus, the composite piezoelectric element 10 has low measurement sensitivity to the deformation of the belt-like portions 13a to 13c in the lateral direction.

Each cutout 17 has a slit shape continuous in the longitudinal direction (X-direction) of the belt-like portions 13a to 13c in plan view. The contiguous slit shape of the cutouts 17 allows the influence of the deformation of the object to be measured in the lateral direction of the belt-like portions 13a to 13c allows the influence on the piezoelectric substance layer 13 to be effectively buffered by the cutouts 17. In other words, the deformation of the object to be measured, if generated in the lateral direction of the belt-like portions 13a to 13c, is absorbed by the slit-like cutouts 17 and is transmitted to the piezoelectric substance layer 13. In contrast, if the object to be measured is deformed in the longitudinal direction of the belt-like portions 13a to 13c, the cutouts 17 does not buffer the influence on the piezoelectric substance layer 13. In other words, the deformation of the object to be measured, if generated in the longitudinal direction of the belt-like portions 13a to 13c, is transmitted to the piezoelectric substance layer 13 without being absorbed by the slit-like cutouts 17. Thus, the composite piezoelectric element 10 can buffer the influence of the deformation of the belt-like portions 13a to 13c in the lateral direction in measuring the deformation in the longitudinal direction to measure the deformation in the longitudinal direction with high sensitivity and accuracy.

Providing the buffer portions 16 each including the cutout 17 between the belt-like portions 13a to 13c allows the measurement sensitivity to be significantly changed depending on whether the direction in which the object to be measured is deformed is the lateral direction or the longitudinal direction of the belt-like portions 13a to 13c. This allows the composite piezoelectric element 10 to measure a force applied in a specific direction with high sensitivity and accuracy. In other words, decreasing the detection sensitivity to a force applied in directions other than a specific direction (for example, a direction orthogonal to the specific direction) reduces the tendency to pick up noise (components in the directions other than the specific direction).

The base film 11 is a flexible synthetic resin film on which the first electrode layer 12 is disposed. Example of the synthetic resin include polyimide (PI), polyethylene terephthalate (PET), polyethylene naphthalate (PEN), polyphenylene sulfide (PPS), polyethylene (PE), and aramid resin (aromatic polyamide). The synthetic resin may contain an additive agent, such as a curing agent, an inorganic filler, or the like or may be an insulative film. The thickness of the base film 11 may be, for example, from about 25 to 125 μm.

As shown in FIGS. 1A to 1C, the first electrode layer 12 is a synthetic resin matrix that is laid on one surface of the base film 11 and in which electrically conductive powder is dispersed. Examples of the synthetic resin include phenol resin, polyurethane resin, epoxy resin, polyester resin, and acrylic resin. Examples of the electrically conductive powder include metal powder, such as silver, copper, and nickel, and carbon powder, such as black lead and nano-carbon. The electrically conductive powder is dispersed in the synthetic resin at about 5 to 70 (% by volume), for example. The thickness of the first electrode layer 12 is, for example, from about 5 to 15 μm.

As shown in FIGS. 1A to 1C, the second electrode layer 14 is laid on the piezoelectric substance layer 13 on one side of the base film 11, with the piezoelectric substance layer 13 interposed between the first electrode layer 12 and the second electrode layer 14. The second electrode layer 14 is a synthetic resin matrix in which electrically conductive powder is dispersed, like the first electrode layer 12, and has a thickness from about 5 to 20 μm, for example.

The first electrode layer 12 and the second electrode layer 14 can be formed using screen printing or another method with electrically conductive paste formed by adding a curing agent to synthetic resin, such as a phenol resin, and mixing a solvent, such as carbitol acetate, and electrically conductive powder. The first electrode layer 12 can be formed by applying this electrically conductive paste to the base film 11 and drying and curing by heating it. The second electrode layer 14 can be formed by applying this electrically conductive paste to the piezoelectric substance layer 13 and drying and curing by heating it.

The first electrode layer 12 and the second electrode layer 14 include a terminal 121 and a terminal 141, respectively. The terminal 121 and the terminal 141 are formed so as to be led out to an end of the base film 11, thereby facilitating supply of voltage and extraction of the measurement results.

As shown in FIGS. 1A to 1C, the piezoelectric substance layer 13 is laid on the first electrode layer 12 on one side of the base film 11. FIG. 1A illustrates the position of the piezoelectric substance layer 13 (the belt-like portions 13a, 13b, and 13c, the measuring unit 15) using a thick broken line to indicate the position in plan view. The portion between the first electrode layer 12 and the second electrode layer 14 where there is no piezoelectric substance layer 13 may have an insulator layer or the like to prevent the conduction between the first electrode layer 12 and the second electrode layer 14.

In the viewpoint of increasing the sensitivity in the longitudinal direction, the aspect ratio (length L:width W1) of the belt-like portions 13a to 13c is preferably 1,000:1 or higher and 10:5 or lower, and more preferably 10:1 or higher and 10:3 or lower.

In order to measure a force applied in a specific direction with high sensitivity and accuracy and to increase the output, the aspect ratio (length L:width W2) of the contour shape of the piezoelectric substance layer 13 and the buffer portions 16 as a unit (hereinafter referred to as "the shape of the piezoelectric substance layer 13" as appropriate) in plan view is preferably 10:1 or higher and 10:10 or less, more preferably 10:3 or higher and 10:8 or less, and still more preferably 10:4 or higher and 10:6 or less.

In attaching the composite piezoelectric element 10 to a tire, the length L of the piezoelectric substance layer 13 in the longitudinal direction is preferably from about 10 to 20 mm. For this reason, examples of the preferable shape of the piezoelectric substance layer 13 (length L×width W2) include 15 mm×7 mm and 10 mm×5 mm.

Although this embodiment illustrates the piezoelectric substance layer 13 including three belt-like portions 13a to 13c and two buffer portions 16, the number of belt-like portions 13a to 13c and the number of buffer portions 16 are not limited thereto. However, the width W1 of each of the belt-like portions 13a to 13c is preferably 1 mm or more. For this reason, the number of belt-like portions 13a to 13c is generally from about 2 to 4, and the number of buffer portions 16 is generally from about 1 to 3.

The piezoelectric substance layer 13 is a synthetic resin matrix in which piezoelectric particles are dispersed. The piezoelectric particles are preferably ferroelectric particles with a perovskite crystal structure in the viewpoint of improving the piezoelectric performance of the piezoelectric substance layer 13 to form a composite piezoelectric element 10 with high output performance. The ferroelectric particles are preferably potassium niobate ($KNbO_3$), sodium potassium niobate, or barium titanate.

The potassium niobate preferably has an average particle diameter (median diameter, D50) from 400 to 500 nm, a orthorhombic-to-tetragonal transition temperature of 223° C. or higher and 228° C. or lower, and a tetragonal-to-cubical transition temperature of 420° C. or higher and 430° C. or lower. This allows the piezoelectric performance of the piezoelectric substance layer 13 to be further improved, thereby providing the composite piezoelectric element 10 with higher output performance.

The piezoelectric substance layer 13 is a composite material of synthetic resin and piezoelectric particles and has flexibility. The synthetic resin preferably has moderate softness at normal temperature in the viewpoint of preventing the occurrence of cracks due to the deformation of the piezoelectric substance layer 13. The synthetic resin is preferably non-crystalline polyester resin or polyurethane resin. The non-crystalline polyester resin and the polyurethane resin are preferable also in that they are commonly used extensively and can be easily and inexpensively obtained.

Although the piezoelectric substance layer 13 shown in FIGS. 1B and 1C is a single layer, the piezoelectric substance layer 13 may be constituted of multiple layers. For example, the piezoelectric substance layer 13 may be constituted of two first piezoelectric substance layers and a second piezoelectric substance layer disposed between the two first piezoelectric substance layers. In this case, the volume percent of the piezoelectric particles in the two first piezoelectric substance layers is preferably higher than the volume percent of the piezoelectric particles in the second piezoelectric substance layer therebetween. In an example in which potassium niobate is used as the piezoelectric particles, the volume percent of the piezoelectric particles in the first piezoelectric substance layers is preferably from 50 to 65 vol %. The volume percent of the piezoelectric particles in the second piezoelectric substance layer is preferably from 0.01 to 60 vol %, and more preferably from 10 to 50 vol %.

Setting the volume percent of the piezoelectric particles of the second piezoelectric substance layer lower improves resistance to bending, that is, bending resistance. The improve in the bending resistance of the second piezoelectric substance layer increases the bending resistance of the entire piezoelectric substance layer 13 as compared with a case of a single layer piezoelectric substance whose volume percent of the piezoelectric particles is high. Moreover, the structure in which the second piezoelectric substance layer is disposed between the first piezoelectric substance layers whose volume percent of the piezoelectric particles is high gives a higher priority to the performance of the first piezoelectric substance layer, thereby preventing the piezoelectric performance of the entire piezoelectric substance layer 13 from significantly decreasing. This allows providing a composite piezoelectric element 10 with increased bending resistance while maintaining the piezoelectric performance. Interposing the second piezoelectric substance layer whose volume percent of the piezoelectric particles is low allows forming the piezoelectric substance layer 13 in which the piezoelectric performance is maintained while reducing the amount of expensive piezoelectric particles used.

For example, the piezoelectric substance layer 13 can be manufactured as follows.

First, a binder resin, such as a non-crystalline polyester resin or a polyurethane resin that is soluble in a solvent, carbitol acetate or another solvent, and potassium niobate powder are mixed at a desired compounding ratio and are dispersed uniformly with a mixer, such as a triple roll mill to produce dielectric paste.

Next, the dielectric paste is applied so as to cover and overlap with the first electrode layer 12 in plan view on one side of the base film 11 using a method of screen printing or the like and is dried and hardened to form the piezoelectric substance layer 13. FIG. 1A illustrates an example in which the belt-like portions 13a to 13c are formed on the three teeth of the comb-like first electrode layer 12 in plan view, as indicated by the broken lines. Alternatively, the piezoelectric substance layer 13 may be formed so as to overlap with the entire first electrode layer 12, including the portions connecting the three teeth. The thickness of the hardened piezoelectric substance layer 13 is preferably from 5 to 100 μm, and more preferably from 15 to 50 μm.

The dielectric paste described above may contain a small amount of curing agent as appropriate or an antifoam agent. A processing for making a silane coupling agent carried on the surface of the potassium niobate power. In particular, adding the antifoam agent or performing the processing for the silane coupling agent prevents defects, such as bubbles, in the piezoelectric substance layer 13, thereby reducing poor continuity in the thickness direction of the piezoelectric substance layer 13.

Lastly, the formed piezoelectric substance layer 13 is subjected to polarization processing. The polarization processing is such that the formed piezoelectric substance layer 13 is heated to a temperature around a Curie point and is subjected to a direct-current voltage from about 1 to 10 (V/μm) according to the thickness of the piezoelectric substance layer 13 through the terminal 121 of the first electrode layer 12 and the terminal 141 of the second electrode layer 14 shown in FIG. 1A. After the temperature is returned to a normal temperature, the first electrode layer 12 and the second electrode layer 14 are short-circuited to remove excess capacity, and the process ends. The direct-current voltage applied is preferably from 4 to 6 (V/μm). Thus, the piezoelectric substance layer 13 can easily be processed from the initial state to the polarized state.

Since the first electrode layer 12, the piezoelectric substance layer 13, and the second electrode layer 14 provided on the surface of the base film 11 are synthetic resin in which filler is dispersed, as described above, the composite piezoelectric element 10 has flexibility as a whole.

Although the composite piezoelectric element 10 in FIGS. 1A to 1C includes no overcoat member, the composite piezoelectric element 10 may include an overcoat member that protects it from an external environment. An example of the overcoat member is an insulating paste based on an insulating polyurethane resin containing pigment. The insulating paste is applied and laid over the entire second electrode layer 14 using a method of screen printing or the like and is dried and hardened by heating it. The thickness of the hardened overcoat member ranges from about 10 to 100 μm. In addition to polyurethane resin, acrylic resin, polyester resin, epoxy resin, or the like may be used for the overcoat member.

Since the composite piezoelectric element 10 is formed using an easy, unexpensive screen printing method, as described above, the composite piezoelectric element 10 can be manufactured easily at low cost.

Figure 2A:
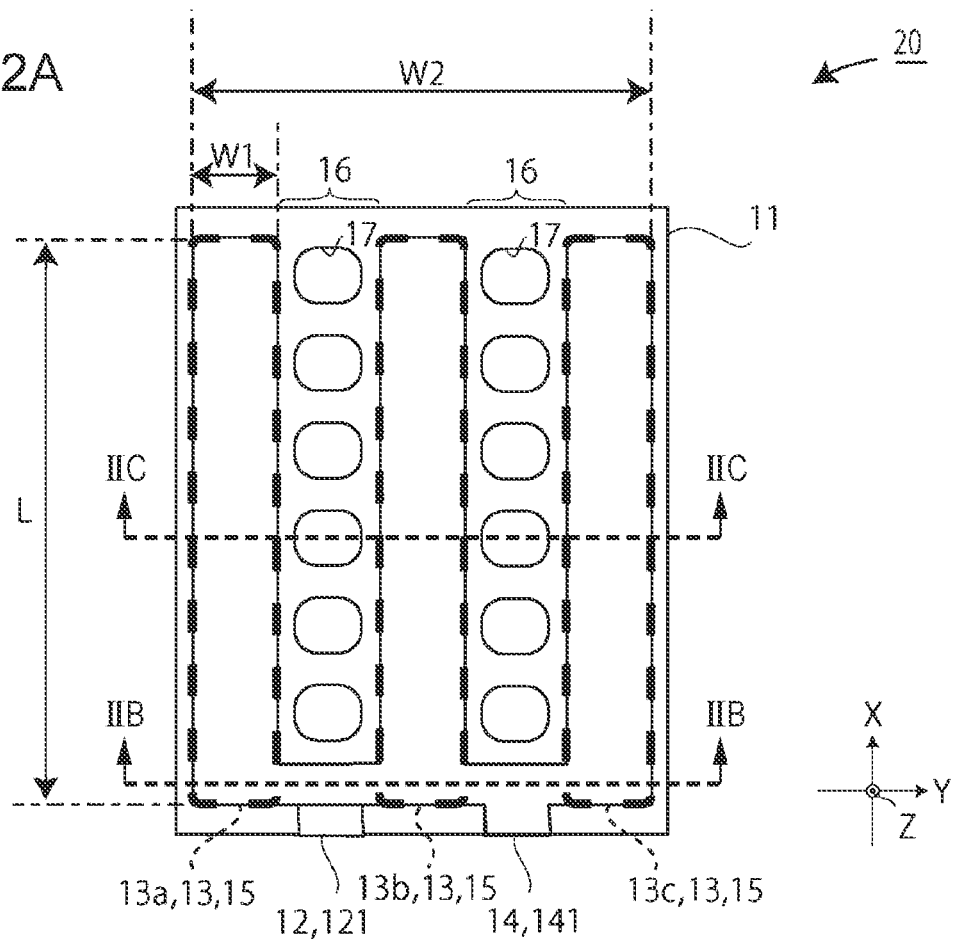
FIG. 2A is a schematic plan view of a composite piezoelectric element which is a modification of the first embodiment illustrating the configuration thereof.
Figure 2B:
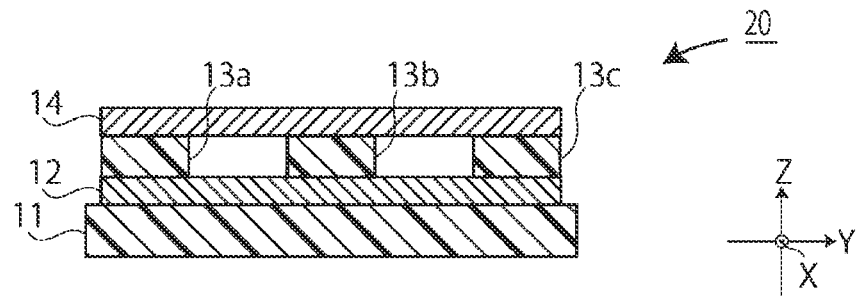
FIG. 2B is a cross-sectional view taken from arrows IIB-IIB in FIG. 2A.
Figure 2C:
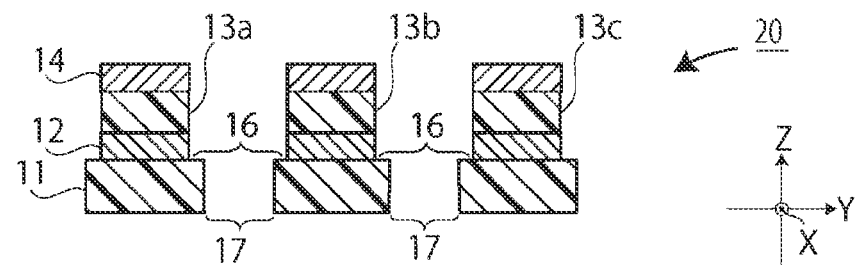
FIG. 2C is a cross-sectional view taken from arrows IIC-IIC in FIG. 2A.

FIG. 2A is a schematic plan view of a composite piezoelectric element 20 which is a modification of this embodiment illustrating the configuration thereof, FIG. 2B is a cross-sectional view taken from arrows IIB-IIB in FIG. 2A, and FIG. 2C is a cross-sectional view taken from arrows IIC-IIC in FIG. 2A. As shown in FIG. 2A, buffer portions 16 of the composite piezoelectric element 20 include a plurality of cutouts 17 in the longitudinal direction of the belt-like portions 13a to 13c. Thus, the configuration in which the buffer portions 16 include the plurality of intermittent cutouts 17 gives anisotropy to the measurement sensitivity of the measuring units 15. This allows the composite piezoelectric element 20 to measure the deformation of the belt-like portions 13a to 13c in the longitudinal direction with high sensitivity and accuracy, like the composite piezoelectric element 10.

Second Embodiment

Figure 3A:
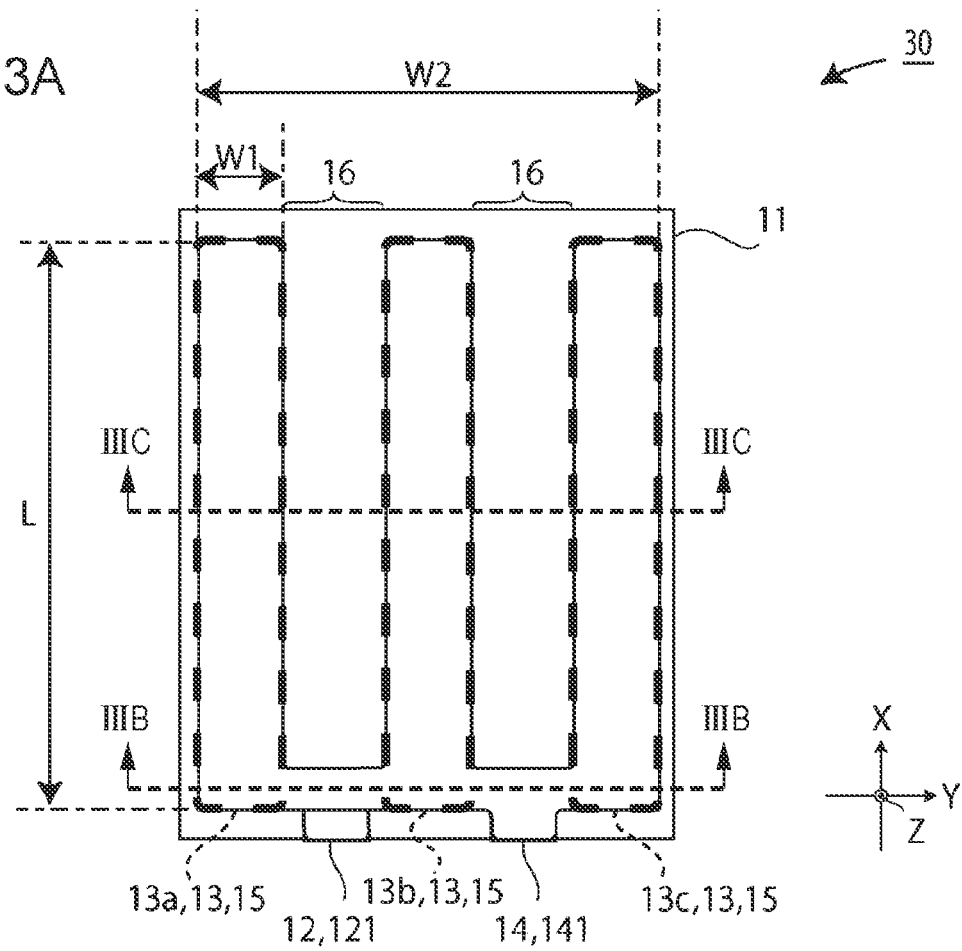
FIG. 3A is a schematic plan view of a composite piezoelectric element according to a second embodiment illustrating the configuration thereof.
Figure 3B:
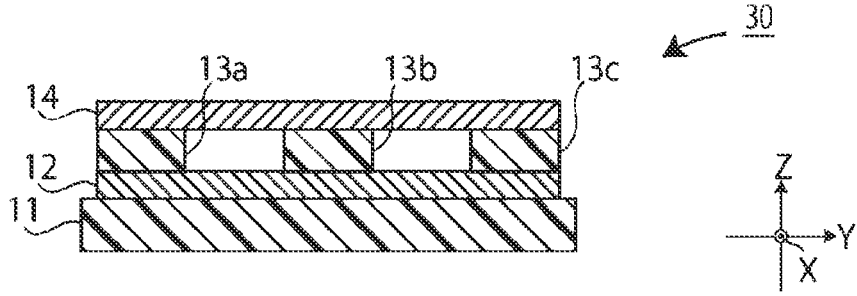
FIG. 3B is a cross-sectional view taken from arrows IIIB-IIIB in FIG. 3A.
Figure 3C:
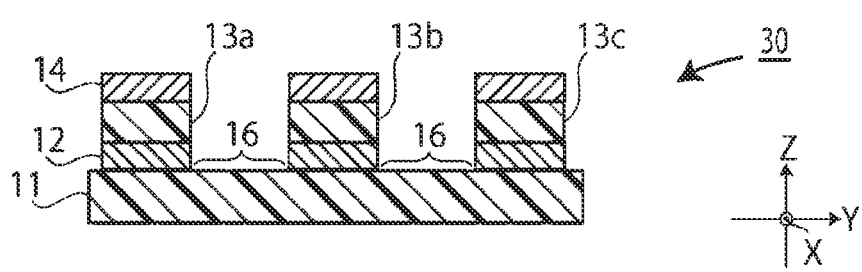
FIG. 3C is a cross-sectional view taken from arrows IIIC-IIIC in FIG. 3A.

FIG. 3A is a schematic plan view of a composite piezoelectric element 30 of this embodiment illustrating the configuration thereof, FIG. 3B is a cross-sectional view taken from arrows IIIB-IIIB in FIG. 3A, and FIG. 3C is a cross-sectional view taken from arrows IIIC-IIIC in FIG. 3A. As the drawings show, the composite piezoelectric element 30 of this embodiment differs from the composite piezoelectric element 10 of the first embodiment in the configuration in which the base film 11 is formed over the entire composite piezoelectric element 30 including the buffer portions 16.

In the composite piezoelectric element 10 of the first embodiment, described above, the buffer portions 16 each have the cutout 17 to increase the difference in measurement sensitivity between the lateral direction and the longitudinal direction of the belt-like portions 13a to 13c. In contrast, in the composite piezoelectric element 30 of this embodiment, the buffer portions 16 have not the cutouts 17, but the Young's modulus of the buffer portions 16 is smaller than that of the measuring unit 15, so that the buffer portions 16 are likely to be deformed in the lateral direction of the belt-like portions 13a to 13c. For this reason, if the object to be measured is deformed in the lateral direction, the buffer portions 16 are deformed earlier than measuring units 15, thereby buffering a force in the lateral direction applied to the measuring units 15. This allows the composite piezoelectric element 30 to measure the deformation of the belt-like portions 13a to 13c in the longitudinal direction with high sensitivity and accuracy.

In the viewpoint of measuring the deformation in the specific direction with high sensitivity and accuracy, the Young's modulus of the buffer portions 16 is preferably smaller than the Young's modulus of the measuring units 15, and more preferably one half or less of the Young's modulus of the measuring units 15, and still more preferably one tenth or less of the Young's modulus of the measuring units 15. The Young's moduli of the measuring units 15 and the buffer portions 16 are Young's moduli in the X-Y plane of FIG. 3A. The Young's modulus of the measuring unit 15 is the Young's modulus of the laminate of the base film 11, the first electrode layer 12, the piezoelectric substance layer 13, and the second electrode layer 14. The Young's modulus of the buffer portion 16 is the Young's modulus of the base film 11.

Figure 4A:
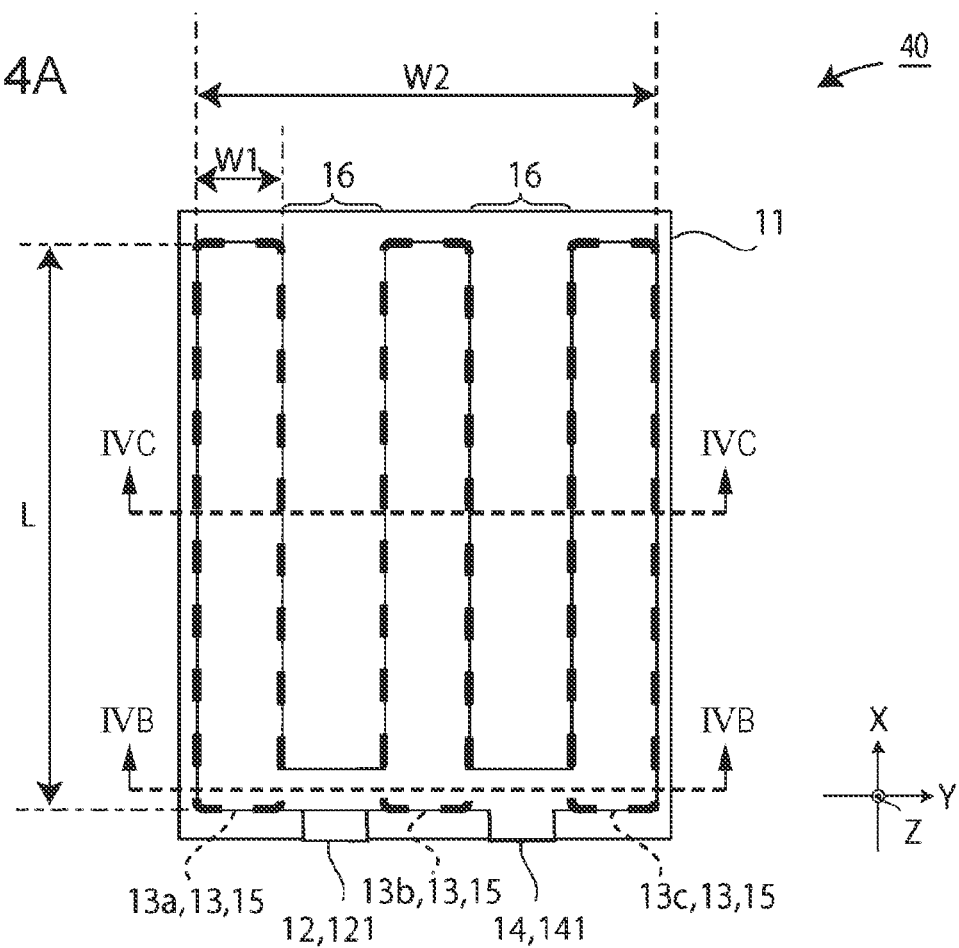
FIG. 4A is schematic plan view of a composite piezoelectric element which is a modification of the second embodiment illustrating the configuration thereof.
Figure 4B:
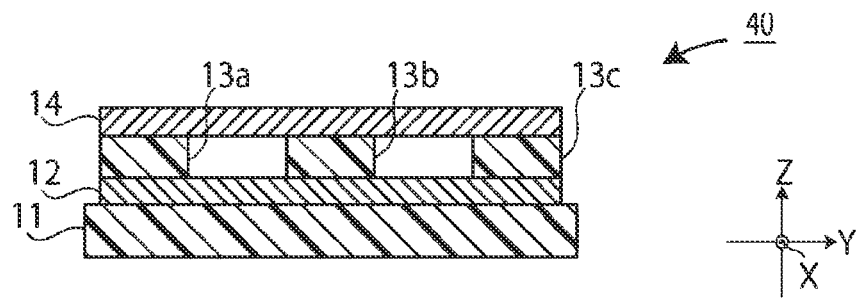
FIG. 4B is a cross-sectional view taken from arrows IVB-IVB in FIG. 4A.
Figure 4C:
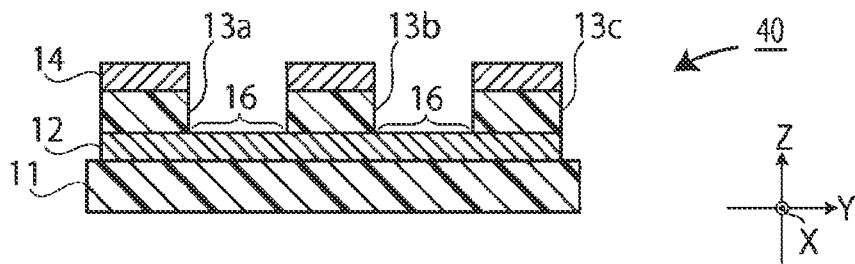
FIG. 4C is a cross-sectional view taken from arrows IVC-IVC in FIG. 4A.

FIG. 4A is schematic plan view of a composite piezoelectric element 40 of a modification of this embodiment illustrating the configuration thereof, FIG. 4B is a cross-sectional view taken from arrows IVB-IVB in FIG. 4A, and FIG. 4C is a cross-sectional view taken from arrows IVC-IVC in FIG. 4A. As shown in the drawings, in the composite piezoelectric element 40, in addition to the base film 11, the first electrode layer 12 is formed over the entire composite piezoelectric element 40 including the buffer portions 16 in plan view. The buffer portions 16 are therefore constituted of the laminate of the base film 11 and the first electrode layer 12.

Also in the case where the buffer portions 16 are constituted of a component other than the base film 11, the buffer portions 16 are deformed earlier than the measuring units 15 by making the Young's modulus of the buffer portions 16 lower than the Young's modulus of the measuring units 15. This allows buffering the lateral force of the belt-like portions 13a to 13c applied to the measuring units 15. Thus, the composite piezoelectric element 40 can measure the longitudinal deformation of the belt-like portions 13a to 13c with high sensitivity and accuracy.

Third Embodiment

Figure 5A:
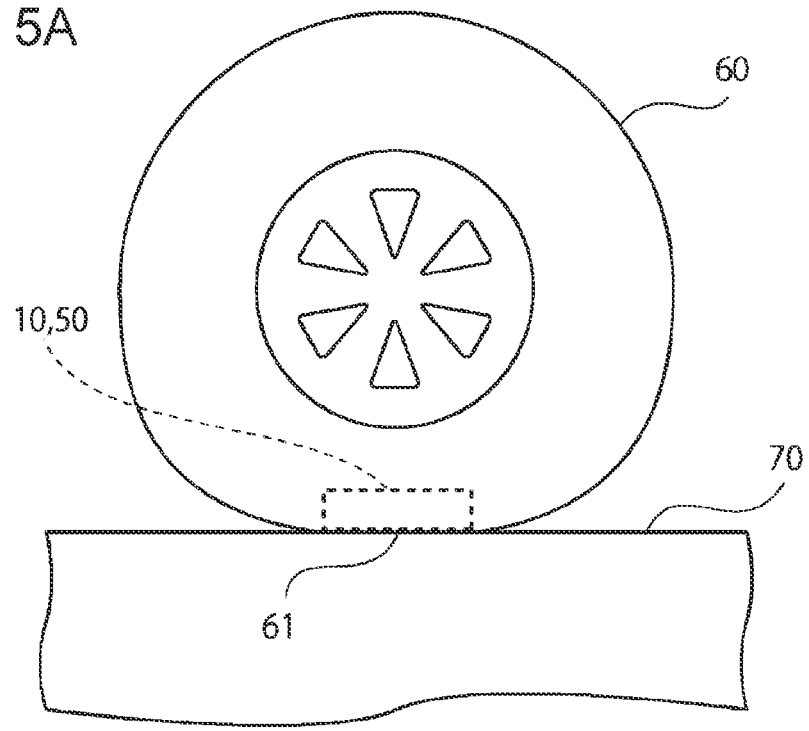
FIG. 5A is a schematic plan views of a tire measured by a tire-condition measuring apparatus according to a third embodiment, illustrating a state in which the tire is not rotating while the automobile is parked and stopped.
Figure 5B:
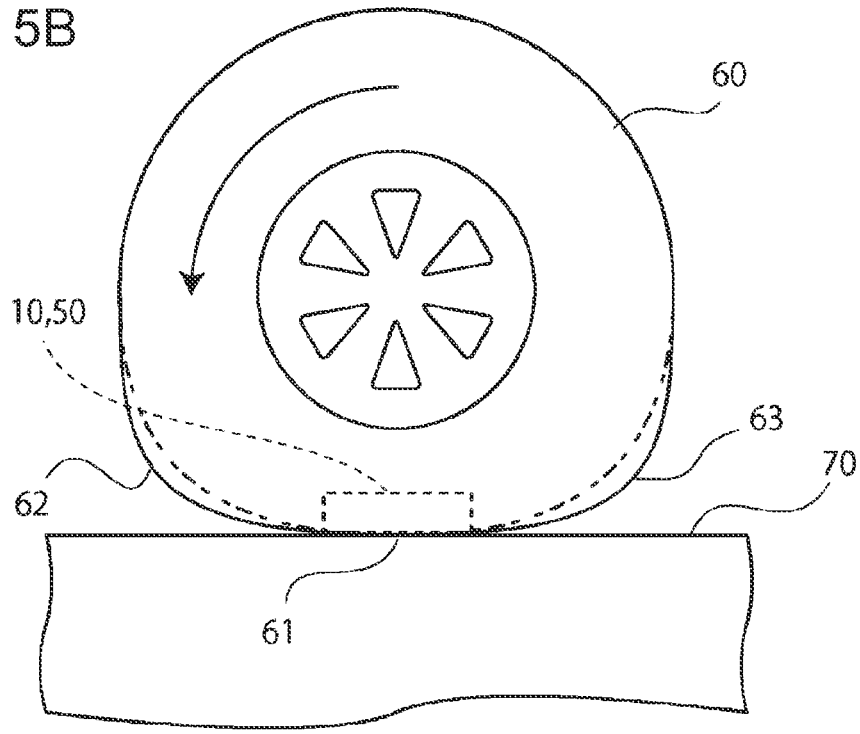
FIG. 5B illustrates a state in which the tire is rotating during moving.

A case in which the present invention is embodied as a tire-condition measuring apparatus including a composite piezoelectric element will be described. FIGS. 5A and 5B are schematic plan views of a tire 60 to be measured by a tire-condition measuring apparatus 50 including the composite piezoelectric element 10, according to this embodiment, illustrating the state thereof.

FIG. 5A illustrates a state in which the tire 60 mounted to an automobile or the like is not rotating. As shown in the drawing, a grounding portion 61 of the tire 60, that is, a portion in contact with a road surface 70, extends in the circumferential direction of the tire because of the weight of the automobile while the automobile is parked and stopped during which the tire 60 does not rotate.

FIG. 5B illustrates a state in which the tire 60 mounted to an automobile or the like is rotating in the direction of the arrow. As shown in the drawing, the tire 60 rotating while the automobile is moving extends at the grounding portion 61 in contact with the road surface 70 in the circumferential direction of the tire 60, and contracts at an upstream portion 62 and a downstream portion 63 adjacent to the grounding portion 61. The speed of the deformation of the tire 60 along with the periodic extension and contraction with the rotation changes according to the condition of the tire 60.

The tire-condition measuring apparatus 50 measures the condition of the tire 60 by measuring the deformation speed using the composite piezoelectric element 10. Examples of the condition of the tire 60 to be measured using the composite piezoelectric element 10 include wear, the hardness of the tire tread, and friction (grip state). The condition of the road surface 70 can also be measured through the condition of the tire 60. Since the deformation speed of the tire 60 can be directly obtained using the composite piezoelectric element 10, the condition of the tire 60 can easily be evaluated.

Since the composite piezoelectric element 10 of the present invention can perform high sensitivity and accuracy measurement in a specific direction, the composite piezoelectric element 10 is suitable for measurement of deformation (extension and contraction) in a specific direction, such as the rotational direction (circumferential direction) of the tire 60 and a direction orthogonal to the rotational direction. For example, when the composite piezoelectric element 10 is disposed so that the longitudinal direction (the X-direction, see FIG. 1) of the belt-like portions 13a to 13c of the piezoelectric substance layer 13 agrees with the circumferential direction of the tire 60, the deformation in the rotational direction of the tire 60 can be measured with high sensitivity and accuracy.

Mounting the composite piezoelectric element 10 of the tire-condition measuring apparatus 50 to the back of the tire 60 (opposite to the surface in contact with the road surface 70) allows measuring the condition of the tire 60. For example, the tire-condition measuring apparatus 50 can be mounted by attaching the composite piezoelectric element 10 to the tire 60 with an adhesive, such as epoxy.

Information on the condition of the tire 60 obtained by the tire-condition measuring apparatus 50 may be used alone or in combination with information obtained from another apparatus. The other apparatus may be a tire pressure monitoring system (TPMS) that monitors the tire pressure of an automobile.

Fourth Embodiment

A tire-condition measuring apparatus including a composite piezoelectric element embodied as a tire sensor including a tire sensor module and a container will be described.

Figure 14:
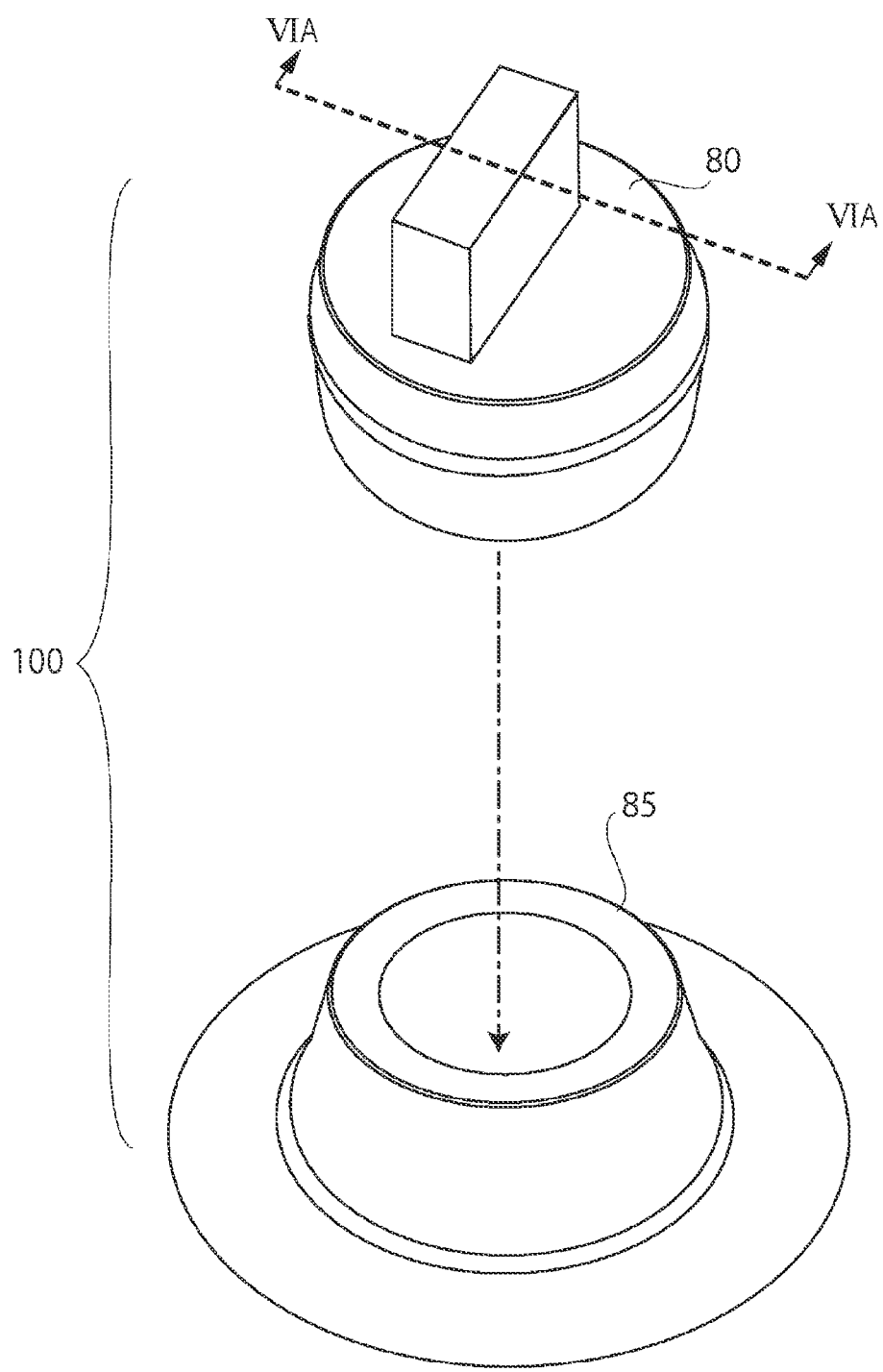
FIG. 14 is a perspective view of a tire sensor in which the tire sensor module and the container are separated.
Figure 15:
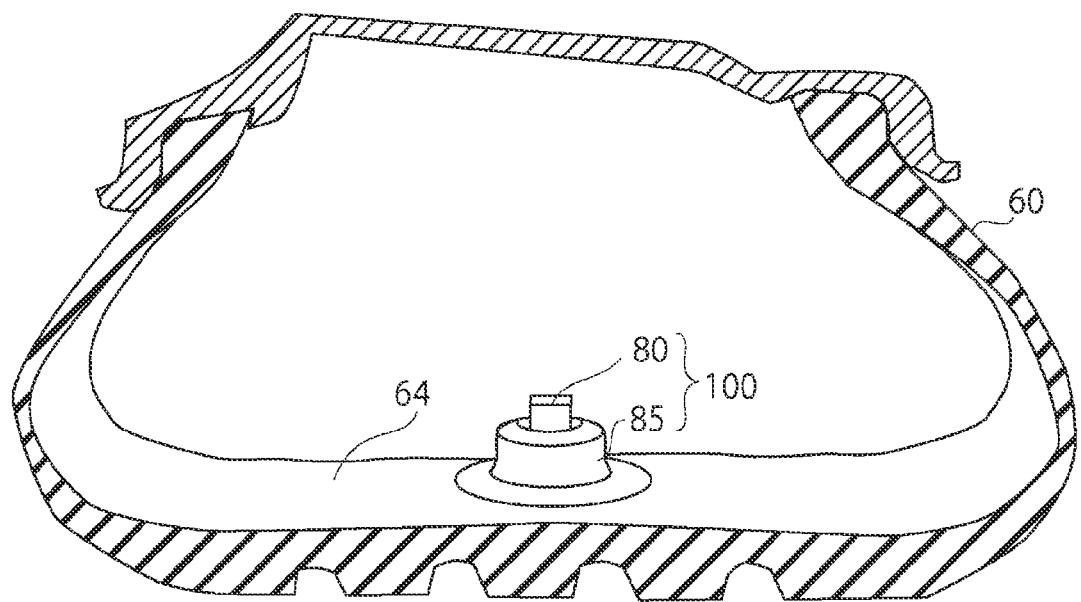
FIG. 15 is a partially sectional perspective view of the tire sensor attached to a tire.

FIG. 14 is a perspective view of a tire sensor in a separated state, and FIG. 15 is a partially sectional perspective view of the tire sensor attached to a tire. As shown in FIG. 14, the tire sensor 100 includes a tire sensor module 80 and a container 85 configured to contain the tire sensor module 80. As shown in FIG. 15, the tire sensor 100 measures the condition of the tire 60 in a state in which the tire sensor module 80 contained in the container 85 is attached to the inner surface 64 of the tire 60.

The container 85 is deformable according to the deformation of the tire 60. The container 85 is made of resin with a Young's modulus from about 10 to 1,000 MPa, which is the same as that of the tire 60. Any method may be used to attach the container 85 to the inner surface 64 of the tire 60. One example is a method of attachment using an adhesive, such as an epoxy adhesive or a cyanoacrylate instant adhesive.

Figure 6A:
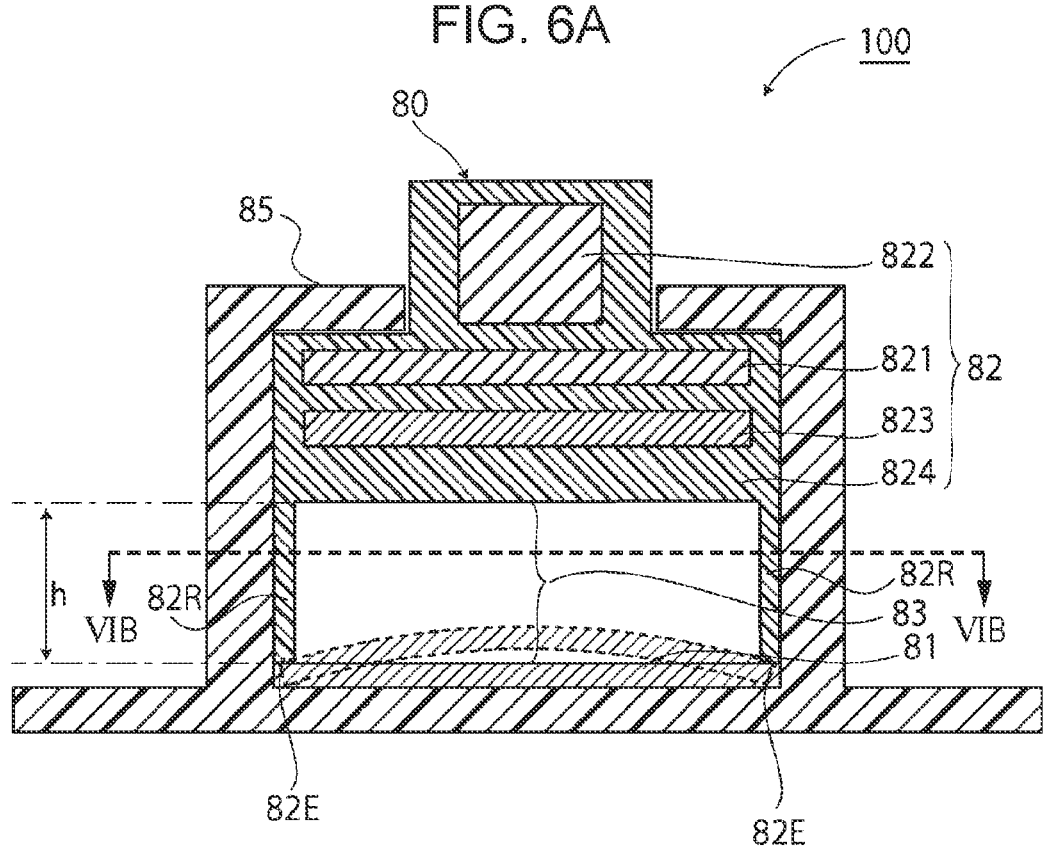
FIG. 6A is a cross-sectional view of a tire sensor module and a tire sensor according to a fourth embodiment.
Figure 6B:
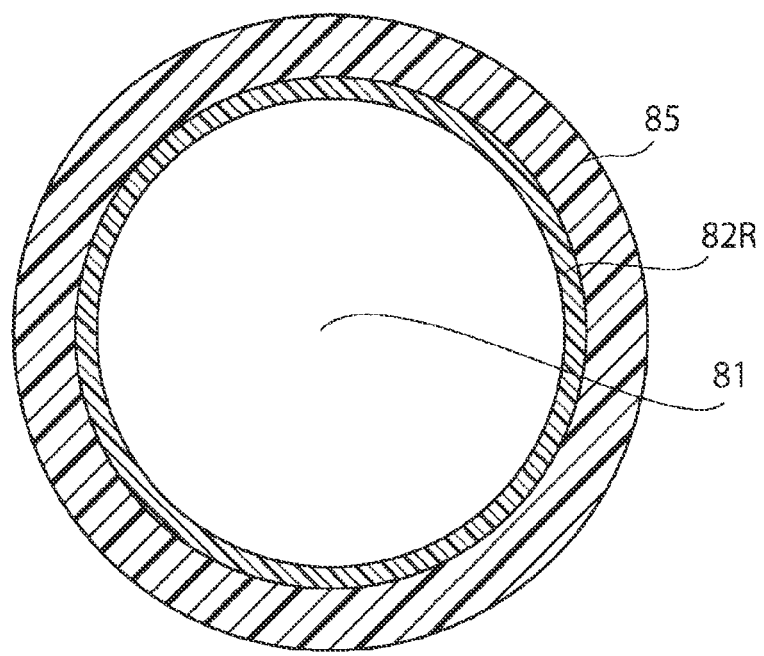
FIG. 6B is a cross-sectional view taken from arrows VIB-VIB in FIG. 6A.

FIG. 6A is a cross-sectional view of the structure of the tire sensor module of this embodiment, schematically illustrating the structure of the tire sensor 100 in FIG. 14 taken from arrows VIA-VIA. FIG. 6B is a cross-sectional view taken from arrows VIB-VIB in FIG. 6A.

The tire sensor module 80 includes a sheet-like piezoelectric sensor 81, a control unit 82, and a buffer portion 83. The piezoelectric sensor 81 electrically detects the deformation of the tire 60 (see FIG. 15) by converting the deformation (deformation speed) generated in the tire 60 to voltage. For example, the piezoelectric sensor 81 may have the same configuration as that of the composite piezoelectric element shown in FIGS. 1A to 4C in which a piezoelectric substant is placed between two electrodes. The piezoelectric sensor 81 detects the deformation of the tire 60 via the container 85 that is deformable following the tire 60. The piezoelectric sensor 81 is electrically connected to the control unit 82 of the tire sensor module 80 and is controlled by the control unit 82.

The piezoelectric sensor 81 can directly detect the condition of the tire 60 by being deformed following the tire 60. Examples of the object to be detected (measured) by the piezoelectric sensor 81 include the wear of the tire 60, the hardness of the tire tread, and friction (gripped state). The piezoelectric sensor 81 can also measure the condition of the road surface 70 (see FIG. 5) through the condition of the tire 60.

The control unit 82 includes a substrate 821, a communication unit 822, and a power source 823 sealed by a hard resin 824. Since the Young's modulus of the control unit 82 is the Young's modulus of a portion forming the outer shell of the control unit 82, the Young's modulus of the hard resin 824 is the Young's modulus of the control unit 82. If the control unit 82 is not sealed by the hard resin 824, among the components of the piezoelectric sensor 81, the Young's modulus of a component with the greatest Young's modulus is the Young's modulus of the control unit 82. However, the substrate 821, the communication unit 822, and the power source 823 constituting the control unit 82 are generally designed to have a Young's modulus substantially equal to that of the hard resin 824.

The substrate 821 includes a computational processing unit, a storage unit, and so on to perform various computing operations, such as computational processing of the measurement results of the piezoelectric sensor 81, and control of the tire sensor module 80. The substrate 821 may include a sensor, a magnet, or the like other than the sheet-like piezoelectric sensor 81, such as a magnetic sensor or an acceleration sensor.

The communication unit 822 transmits the measurement result of the tire sensor module 80 to an external device and receives an input to the computational processing unit of the substrate 821 from an external device via radio communication. Examples of the external device include an electronic control unit (ECU), which is an electronic circuit unit that controls various systems for an automobile, a mobile electronic device, such as a smartphone, in the automobile, and a server connected via a radio communication line.

An example of the power source 823 is a battery that supplies electrical power to the tire sensor module 80.

The hard resin 824 protects the substrate 821, the communication unit 822, and the power source 823 of the control unit 82 and is harder (has a greater Young's modulus) than the container 85, for example, a Young's modulus ranging from about 1 to 5 GPa. Therefore, if the piezoelectric sensor 81 is disposed at the control unit 82 and sealed with the hard resin 824, the deformation of the piezoelectric sensor 81 is inhibited by the hard resin 824. In other words, if the sheet-like piezoelectric sensor 81 is sealed by the hard resin 824 together with the substrate 821, the communication unit 822, and the power source 823, deformation following the tire 60 is restricted by the hard resin 824, which makes it difficult to detect the deformation of the tire 60 with high sensitivity.

For this reason, the tire sensor module 80 is provided with the buffer portion 83 between the piezoelectric sensor 81 and the control unit 82. Providing the buffer portion 83 facilitates deformation of the piezoelectric sensor 81 following the deformation of the tire 60. The embodiment shown in FIGS. 6A and 6B includes a holding unit 82R that protrudes in a ring shape along the outer circumferential surface of the control unit 82 in contact with the container 85. The sheet-like piezoelectric sensor 81 is disposed such that an end 82E of the holding unit 82R encloses the piezoelectric sensor 81 in contact with the vicinity of the circumference of the circular piezoelectric sensor 81. This causes the space that occupies most of the space between the piezoelectric sensor 81 and the control unit 82 to function as the buffer portion 83, thereby facilitating the deformation of the piezoelectric sensor 81 following the tire 60. Furthermore, since the holding unit 82R encloses the piezoelectric sensor 81, the piezoelectric sensor 81 can be held at a predetermined position with stability. Note that the holding unit 82R may have any shape that can hold the piezoelectric sensor 81. For example, the holding unit 82R may have a rod shape, and a plurality of holding units 82R may be disposed along the circle that the holding unit 82R shown in FIG. 6B forms, and the ends 82E thereof may be in contact with the piezoelectric sensor 81.

Providing the buffer portion 83 between the piezoelectric sensor 81 and the control unit 82 as described above allows the piezoelectric sensor 81 to be deformed following the deformation of the tire 60 (see FIG. 15) without interfering with the control unit 82, as indicated by the broken lines in FIG. 6A. In other words, the configuration of the tire sensor module 80 in which the buffer portion 83 is provided between the piezoelectric sensor 81 and the control unit 82 facilitates deformation the piezoelectric sensor 81, allowing the deformation of the tire 60 to be detected with high sensitivity.

The piezoelectric sensor 81 is intended to measure the periodic deformation of the tire 60 along with the rotation thereof (see FIGS. 5A and 5B). However, an instantaneous excess force can be exerted from the tire 60 when the tire 60 treads on a foreign substance. In such a case, if the excess force is exerted on the control unit 82 of the tire sensor module 80, the control unit 82 can be damaged.

In the tire sensor module 80, the buffer portion 83 disposed between the piezoelectric sensor 81 and the control unit 82 prevents an excessive force from being exerted on the control unit 82. For example, if the deformation of the tire 60 when the tire 60 treads on a foreign substance falls within the range of the buffer portion 83, no excessive force is exerted on the control unit 82. Even if the deformation of the tire 60 exceeds the range of the buffer portion 83, the buffer portion 83 can decrease the force to be exerted on the control unit 82. Thus, the buffer portion 83 facilitates deformation of the piezoelectric sensor 81 and prevents an excessive force from being exerted from the tire 60 on the control unit 82 to prevent damage to the control unit 82, thereby improve the reliability of the tire sensor module 80.

In the viewpoint of detecting the deformation of the tire 60 with high sensitivity and improving the reliability of the tire sensor module 80, the height h of the buffer portion 83 is preferably 2 mm or more, and more preferably 5 mm or more. In the viewpoint of reducing the size of the tire sensor module 80, the height h of the buffer portion 83 is preferably 5 mm or less, and more preferably 3 mm or less. Accordingly, to satisfy the reliability and the size reduction, the height h of the buffer portion 83 is preferably from about 2 to 3 mm. The height h of the buffer portion 83 is the distance between the piezoelectric sensor 81 and the control unit 82, as shown in FIG. 6A, and if the distance is not constant, the distance is the distance between the closest portions.

Figure 7:
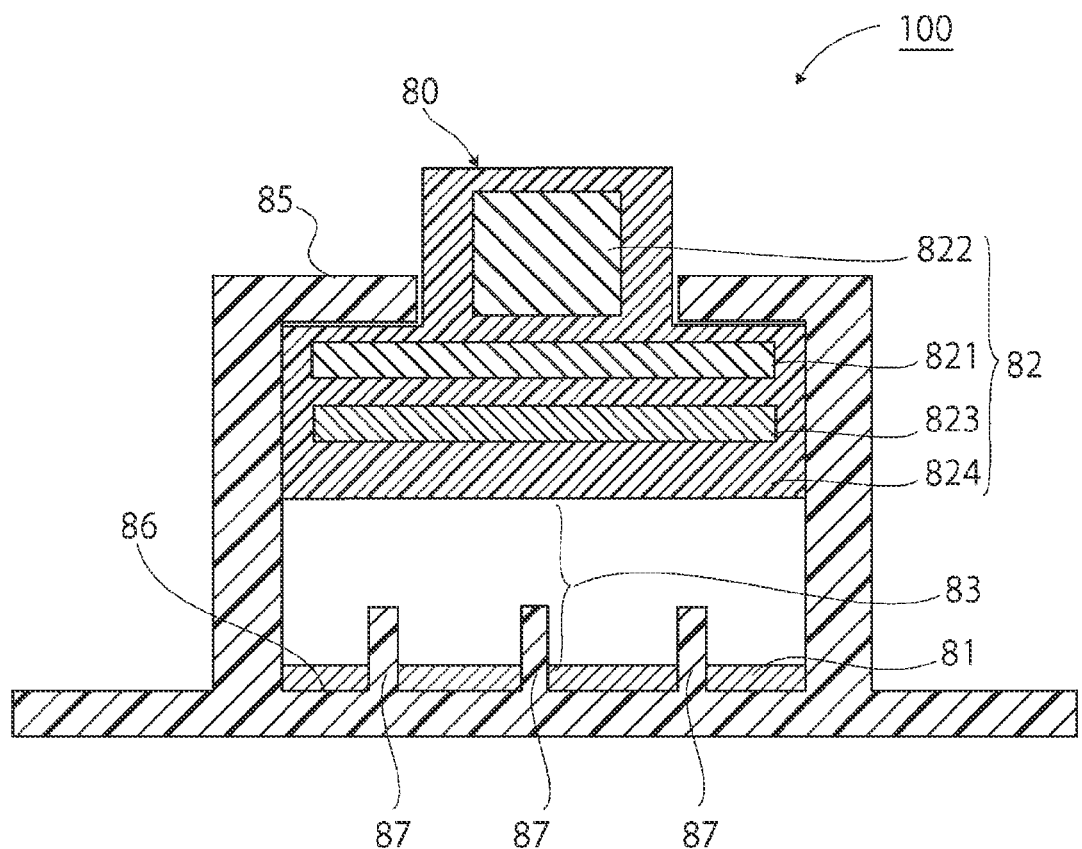
FIG. 7 is a cross-sectional view of a modification of the tire sensor module and the tire sensor of the fourth embodiment.

FIG. 7 is a cross-sectional view of a modification of the tire sensor module and the tire sensor. As shown in the drawing, the tire sensor 100 may include container-side anchors 87 that hold the piezoelectric sensor 81 at a bottom inner surface 86 of the container 85 in contact with the piezoelectric sensor 81. The container-side anchors 87 allow the state in which the piezoelectric sensor 81 is in contact with the bottom inner surface 86 of the container 85 to be kept with more stability. This allows the positional relationship between the piezoelectric sensor 81 and the bottom inner surface 86 to be maintained constant to allow the piezoelectric sensor 81 to detect the deformation of the tire 60 with high accuracy. In the case where the piezoelectric sensor 81 is held by the container-side anchors 87, as shown in FIG. 7, the ring-shaped holding unit 82R (FIGS. 6A and 6B) for holding the piezoelectric sensor 81 is not needed.

Figure 13A:
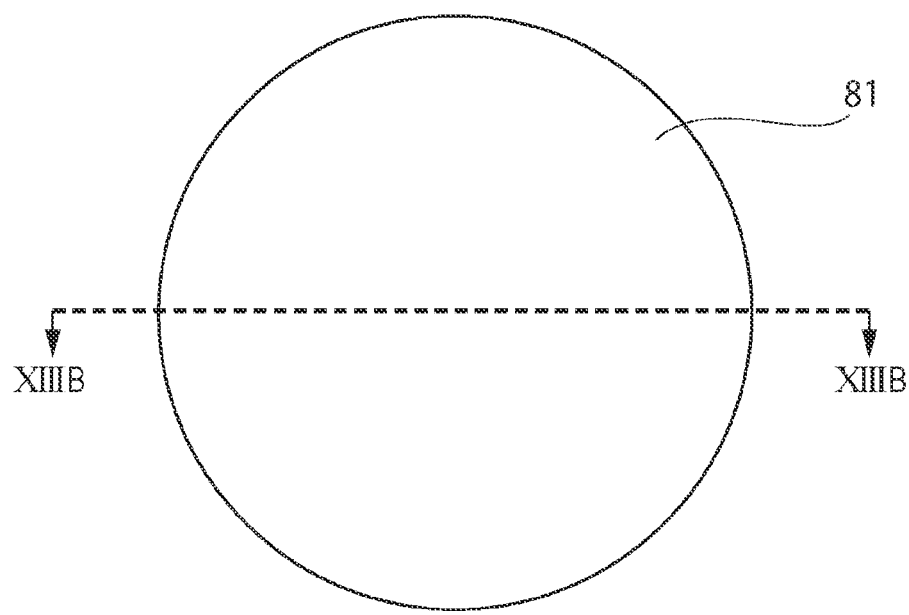
FIG. 13A is a plan view of a piezoelectric sensor.
Figure 13B:
FIG. 13B is a cross-sectional view taken from arrows XIIIB-XIIIB in FIG. 13A.

FIGS. 13A and 13B illustrate the piezoelectric sensor of the present invention. FIG. 13A is a plan view thereof, and FIG. 13B is a cross-sectional view taken from arrows XIIIB-XIIIB in FIG. 13A. The piezoelectric sensor 81 is shaped like a sheet and is circular in plan view viewed from a plane facing the tire 60, that is, in plan view from the normal to the sheet. The circular shape in plan view makes the measurement condition the same regardless of the orientation of the piezoelectric sensor 81. This makes the output the same if the deformation speed and the size are the same, regardless of the direction in which the piezoelectric sensor 81 is deformed. Thus, this facilitates checking the attaching direction in installation to the tire 60 (see FIG. 15). In other words, large variations in output are unlikely to occur even if the orientation of the tire sensor module 80 (the piezoelectric sensor 81) with respect to the tire 60 when being inserted and attached in the container 85 is slightly off. If the piezoelectric sensor 81 is rectangular, its sensitivity is higher to deformation in the lateral direction of the rectangle than to deformation in the longitudinal direction of the rectangle. For this reason, misalignment in the orientation at which the tire sensor module 80 (piezoelectric sensor 81) is attached to the tire 60 tends to influence the output.

The size of the piezoelectric sensor 81 is not particularly limited, but in the viewpoint of obtaining high output, the diameter is preferably 5 mm or more, and more preferably 8 mm or more. In the viewpoint of size reduction, the diameter is preferably 20 mm or less, and more preferably 15 mm or less.

In this embodiment, the piezoelectric sensor is circular in plan view from the normal to the sheet. However, the shape of the piezoelectric sensor is given for mere illustrative purposes. For example, the composite piezoelectric element of the above embodiment shown in FIGS. 1 to 4 may also be used as a piezoelectric sensor. The use of the composite piezoelectric element including the buffer portion provides a tire sensor module with high sensitivity in a specific direction.

Fifth Embodiment

Figure 8:
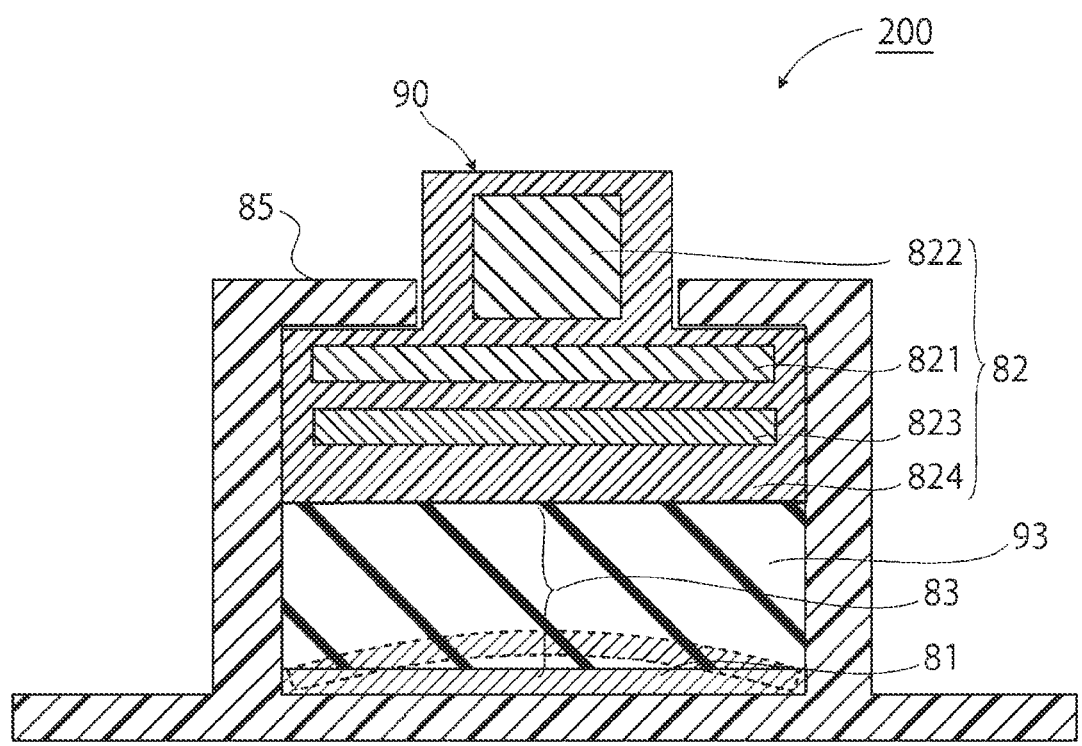
FIG. 8 is a cross-sectional view of a tire sensor module and a tire sensor of a fifth embodiment.

FIG. 8 is a cross-sectional view of a tire sensor module and a tire sensor of this embodiment. A tire sensor module 90 of a tire sensor 200 of this embodiment differs from the tire sensor module 80 of the tire sensor 100 of the first embodiment in a configuration in which a soft portion 93 with a Young's modulus smaller (softer) than that of the hard resin 824 of the control unit 82 is provided in the buffer portion 83. In the present invention, the softness of the material is evaluated using the Young's modulus, and the smaller the Young's modulus, the softer the material (the larger it is, the harder it is).

The soft portion 93 provided in the buffer portion 83 is softer than the hard resin 824. For this reason, the piezoelectric sensor 81 is more likely to be deformed with the deformation of the tire 60 than the case where the piezoelectric sensor 81 is sealed by the hard resin 824. Providing the soft portion 93 in the buffer portion 83 also improves the effect of protecting the control unit 82. Since the soft portion 93 is in contact with both of the piezoelectric sensor 81 and the control unit 82, the relative positional relationship between the piezoelectric sensor 81 and the control unit 82 can be maintained, improving the measurement accuracy, with the measurement condition of the piezoelectric sensor 81 set at a predetermined condition.

The material for the soft portion 93 is preferably softer than the control unit 82, and more preferably softer than the container 85. Examples include urethane resin, natural rubber, synthetic rubber, butadiene rubber, butyl rubber, ethylene propylene rubber, nitrile butadiene rubber, silicone rubber, and acrylic rubber. The Young's modulus of the soft portion 93 is preferably from 10 to 1,000 MPa, more preferably from 10 to 500 MPa, and still more preferably 10 to 100 MPa.

Figure 9:
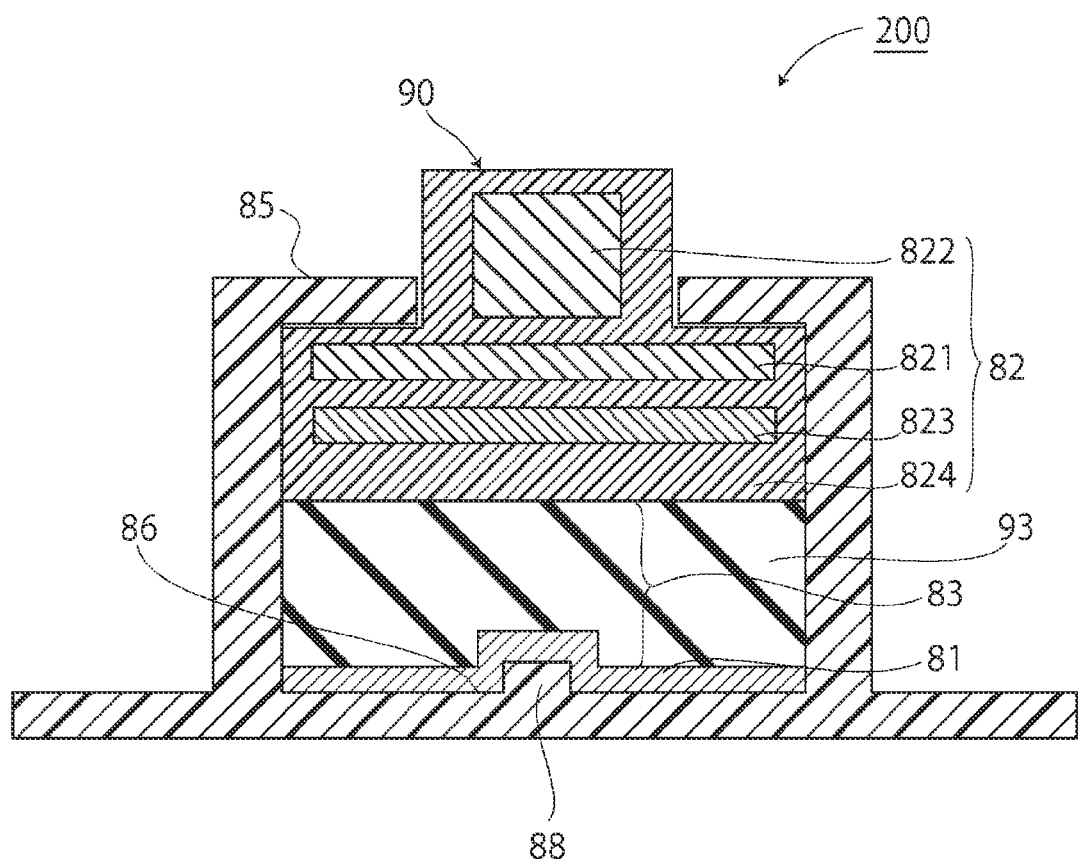
FIG. 9 is a cross-sectional view of a modification of the tire sensor module and the tire sensor of the fifth embodiment.

FIG. 9 is a cross-sectional view of a modification of the tire sensor module and the tire sensor. As shown in the drawing, the tire sensor 200 may include a container-side anchor 88 that holds the piezoelectric sensor 81 at a bottom inner surface 86 of the container 85 in contact with the piezoelectric sensor 81. The container-side anchor 88 allow the state in which the piezoelectric sensor 81 is in contact with the bottom inner surface 86 of the container 85 to be kept. This allows the piezoelectric sensor 81 to detect the deformation of the tire 60 with high sensitivity through the bottom inner surface 86 of the container 85. Unlike the container-side anchors 87 shown in FIG. 7, the container-side anchor 88 shown in FIG. 9 does not pass through the piezoelectric sensor 81 and holds the piezoelectric sensor 81 along the surface of the container-side anchor 88.

Figure 10A:
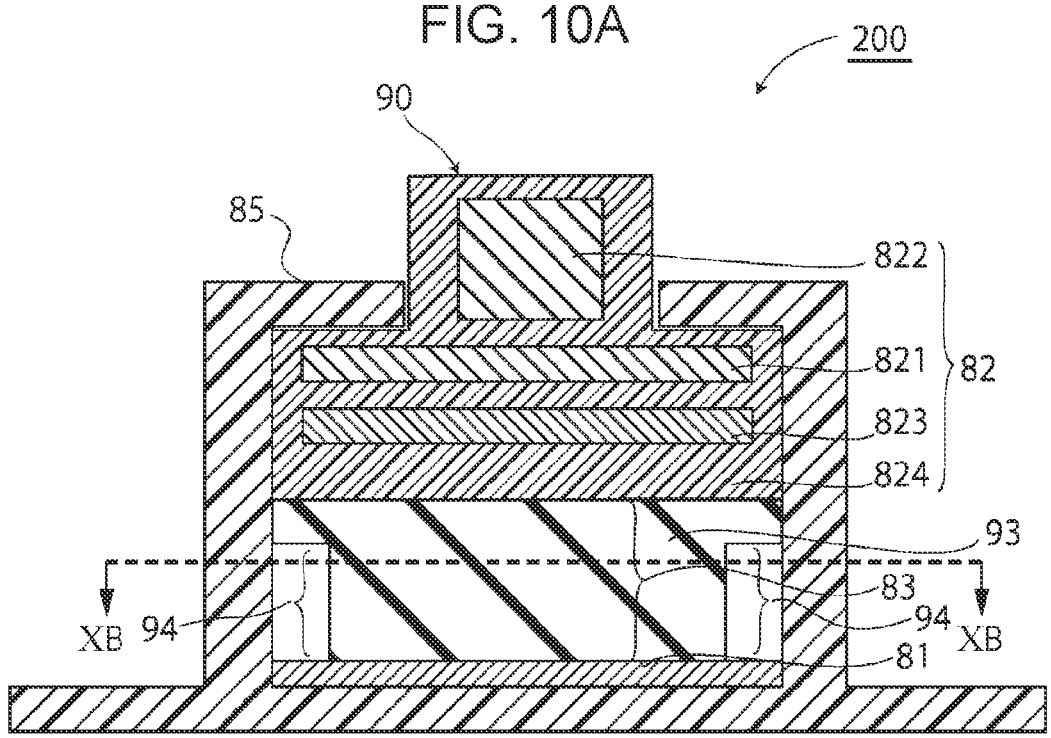
FIG. 10A is a cross-sectional view of a modification of the tire sensor module and the tire sensor of the fifth embodiment.
Figure 10B:
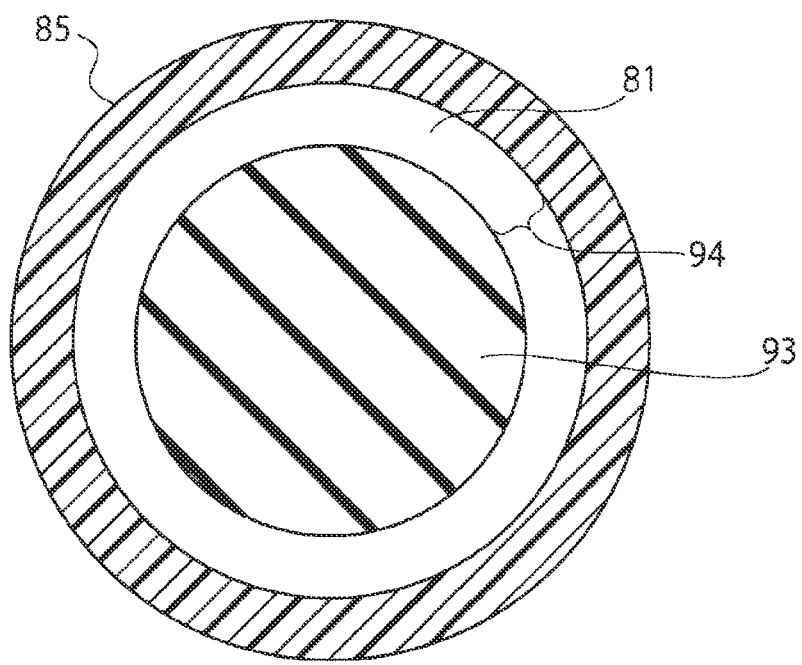
FIG. 10B is a cross-sectional view taken from arrows XB-XB in FIG. 10A.

FIGS. 10A and 10B are cross-sectional views of a modification of the structure of the tire sensor module of this embodiment. As shown in the drawings, the buffer portion 83 of the tire sensor 200 may include a void 94 in which the soft portion 93 is not provided. Providing the void 94 further facilitates deformation of the soft portion 93 in the buffer portion 83, which makes it easier for the piezoelectric sensor 81 to be deformed following the deformation of the tire 60, improving the detection sensitivity of the tire sensor module 90. Since this provides a portion pressed by the soft portion 93 and a portion not pressed in the piezoelectric sensor 81, the detection sensitivity of the tire sensor module 90 is improved.

As shown in FIG. 10B, the piezoelectric sensor 81 is circular in plan view. This is suitable for detecting the deformation of the tire 60 regardless of the direction. As shown in the drawing, the void 94 is provided at a uniform width so as to enclose the outer circumferential surface of the soft portion 93. This configuration makes it easy for the piezoelectric sensor 81 to follow the deformation of the tire 60 similarly in all directions, providing the tire sensor module 90 with high detection sensitivity regardless of the direction of deformation.

Figure 11A:
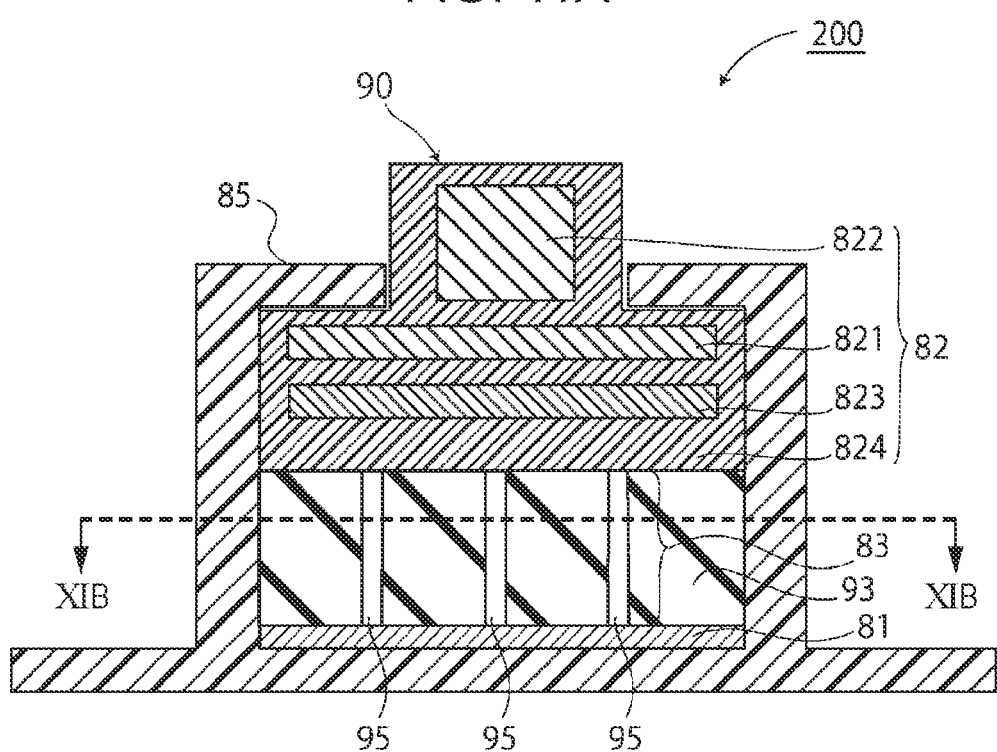
FIG. 11A is a cross-sectional view of a modification of the tire sensor module and the tire sensor of the fifth embodiment.

FIG. 11A is a cross-sectional view of a modification of the structure of the tire sensor module of this embodiment. As shown in the drawing, the soft portion 93 of the tire sensor module 90 may have slits 95. The slits 95 are elongated gaps that divides the soft portion 93. Providing the slits 95 makes it easy for the soft portion 93 to be deformed in the buffer portion 83, like the void 94 (see FIGS. 10A and 10B), improving the detection sensitivity of the tire sensor 200.

Figure 11B:
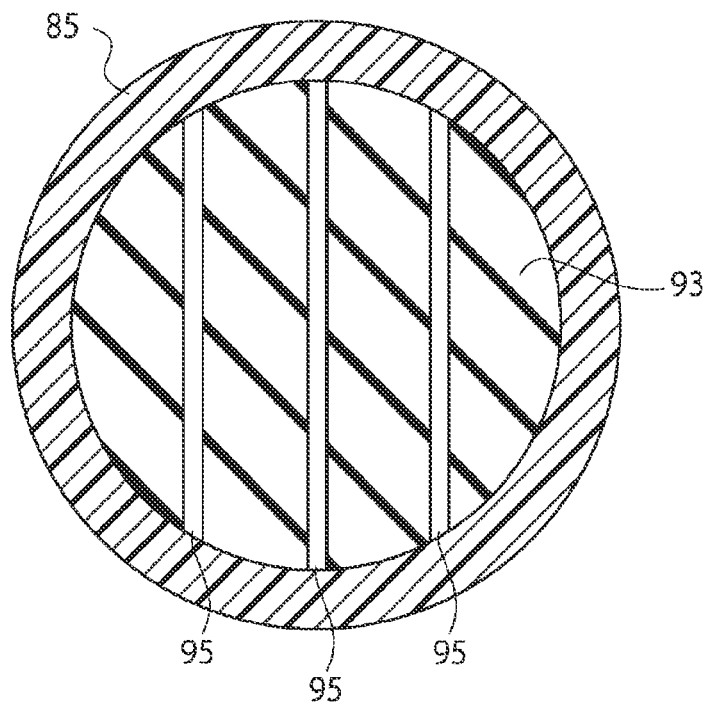
FIG. 11B is a cross-sectional view taken from arrows XIB-XIB in FIG. 11A.

Since the plurality of slits 95 are provided parallel in one direction, as shown in FIG. 11B, the deformability of the soft portion 93 can be changed in relation to the orientation of the slits 95. This allows even the piezoelectric sensor 81 that is circular in plan view to adjust the detection sensitivity according to the direction in which the tire 60 is deformed. For example, disposing the tire sensor 200 so that the rotational direction of the tire 60 (FIG. 5B) is orthogonal to the longitudinal direction of the slits 95 makes it easy for the soft portion 93 to extend and contract in the rotational direction of the tire 60. This provides the tire sensor module 90 that can detect the deformation of the tire 60 in the rotational direction with high sensitivity.

Proving the void 94 or the slits 95, as shown in FIGS. 10A and 10B or FIGS. 11A and 11B, makes it easier for the soft portion 93 to be deformed in the buffer portion 83. This makes it easier for the piezoelectric sensor 81 to be deformed following the tire 60, improving the detection sensitivity of the piezoelectric sensor 81. Furthermore, this makes the detection sensitivity of the piezoelectric sensor 81 the same regardless of the direction in which the tire 60 is deformed or changed according to the direction of the deformation with the configuration of the void 94 or the slits 95. The shapes and numbers of the void 94 and the slits 95 are not limited to the above examples. For example, a grid configuration in which a plurality of slits 95 intersect at right angles in the soft portion 93 allows the detection sensitivity of the piezoelectric sensor 81 to be the same regardless of the deformation direction of the tire 60.

Figure 12:
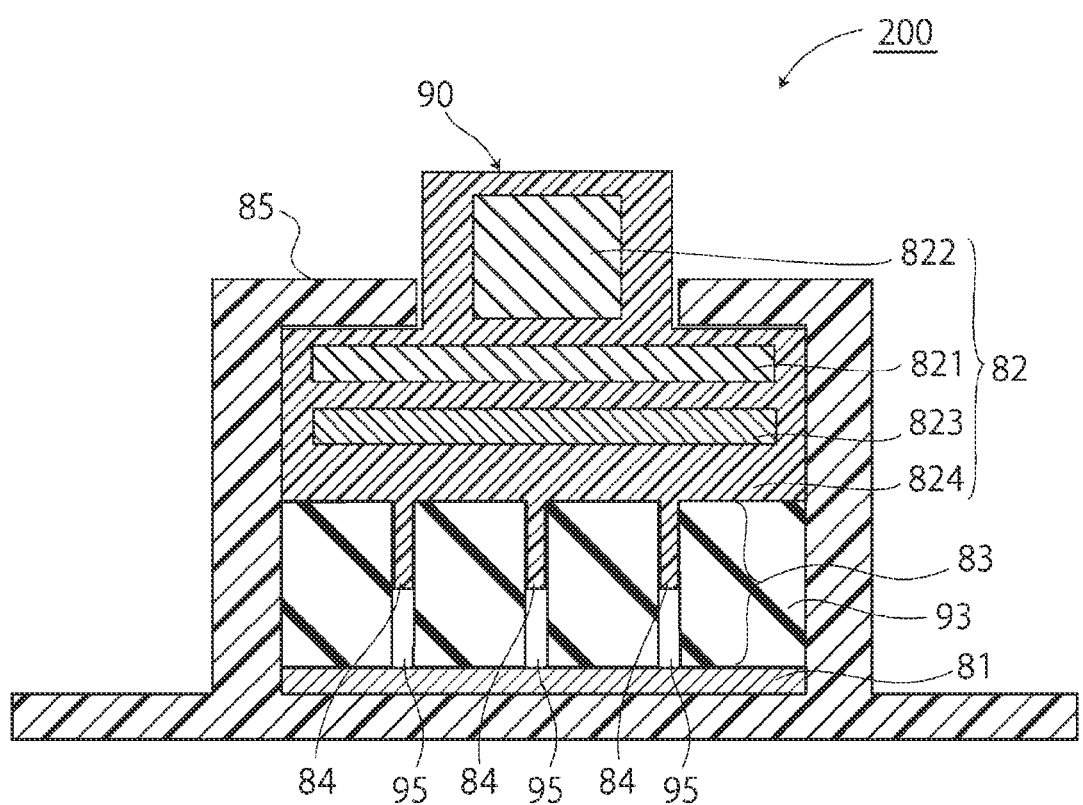
FIG. 12 is a cross-sectional view of a modification of the tire sensor module and the tire sensor of the fifth embodiment.

FIG. 12 is a cross-sectional view of a modification of the tire sensor module and the tire sensor of this embodiment. As shown in the drawing, the control unit 82 of the tire sensor module 90 includes anchors 84 in the buffer portion 83. Since the anchors 84 are inserted in the slits 95 of the soft portion 93, a change in the positional relationship among the soft portion 93, the piezoelectric sensor 81, and the control unit 82 can be reduced. This allows the measurement condition of the piezoelectric sensor 81 to be maintained constant to detect the deformation of the tire 60 with high accuracy.

The present invention is useful as an apparatus for measuring the condition of a tire, such as wear, and the condition of a road surface.

What is claimed is:

1. A tire sensor module comprising:
    a piezoelectric sensor configured to measure a deformation of a tire, the piezoelectric sensor having a sheet-like shape;
    a control unit including circuitry configured to perform computational processing of a measurement result of the piezoelectric sensor; and
    a buffer portion provided between the piezoelectric sensor and the control unit so as to allow a deformation of the piezoelectric sensor,
    wherein the buffer portion includes a soft material portion having a Young's modulus smaller than a Young's modulus of a material forming the control unit,
    and wherein the soft material portion is in contact with the piezoelectric sensor and the control unit.

2. The tire sensor module according to claim 1, wherein the Young's modulus of the soft material portion is from 10 to 1,000 MPa.

3. The tire sensor module according to claim 1, wherein the buffer portion includes the soft material portion and a space.

4. The tire sensor module according to claim 1, wherein the soft material portion is provided with a slit.

5. The tire sensor module according to claim 4, wherein the control unit includes an anchor inserted in the slit.

6. The tire sensor module according to claim 1, wherein the control unit further includes a communication unit.

7. The tire sensor module according to claim 1, wherein the control unit further includes a magnetic sensor, an acceleration sensor, or a magnet.

8. A tire sensor comprising:
    the tire sensor module according to claim 1; and
    a container configured to contain the tire sensor module and to be fixed to an inside surface of a tire, the container being formed of an elastically deformable material.

9. The tire sensor according to claim 8, wherein the container includes:
    a container-side anchor for holding the piezoelectric sensor of the tire sensor module at a predetermined position.

* * * * *